US012183745B2

(12) United States Patent
Zhang et al.

(10) Patent No.: US 12,183,745 B2
(45) Date of Patent: Dec. 31, 2024

(54) DISPLAY PANEL AND DISPLAY APPARATUS

(71) Applicant: Xiamen Tianma Micro-Electronics Co., Ltd., Xiamen (CN)

(72) Inventors: Kunfeng Zhang, Xiamen (CN); Yiqiang Lin, Xiamen (CN); Wei Wu, Xiamen (CN); Boping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 446 days.

(21) Appl. No.: 17/563,610

(22) Filed: Dec. 28, 2021

(65) Prior Publication Data

US 2022/0123027 A1 Apr. 21, 2022

(30) Foreign Application Priority Data

Oct. 8, 2021 (CN) ............................ 202111170212.0

(51) Int. Cl.
*H01L 27/12* (2006.01)
(52) U.S. Cl.
CPC ........ *H01L 27/124* (2013.01); *H01L 27/1218* (2013.01)
(58) Field of Classification Search
CPC .................................................. H01L 27/124
See application file for complete search history.

(56) References Cited

U.S. PATENT DOCUMENTS

2016/0240141 A1* 8/2016 Lee ...................... G09G 3/3258

FOREIGN PATENT DOCUMENTS

CN 108364567 A 8/2018

* cited by examiner

*Primary Examiner* — Peter M Albrecht
(74) *Attorney, Agent, or Firm* — Christensen O'Connor Johnson Kindness PLLC

(57) ABSTRACT

A display panel and a display apparatus includes sub-pixels, and First and second regions arranged along a first direction. First sub-pixel groups in the first region and second sub-pixel groups in the second region are arranged along the first direction, and each include at least two sub-pixels arranged along the second direction. A number of the sub-pixels in the second sub-pixel group close to the first region is greater than a number of the sub-pixels in the second sub-pixel groups away from the first region. The first sub-region of the second region is closer to the first region than the second sub-region. From the first region to the second region, a variation rate of the numbers of the sub-pixels in the second sub-pixel groups in the first sub-region is greater than a variation rate of the numbers of the sub-pixels in the second sub-pixel groups in the second sub-region.

19 Claims, 16 Drawing Sheets

DISPLAY PANEL AND DISPLAY APPARATUS

CROSS-REFERENCE TO RELATED APPLICATION

The present application claims priority to Chinese Patent Application No. 202111170212.0, filed on Oct. 8, 2021, the content of which is incorporated herein by reference in its entirety.

TECHNICAL FIELD

The present disclosure relates to the field of display technologies, and, particularly, relates to a display panel and a display apparatus.

BACKGROUND

With the rapid development of display technologies, in addition to performing traditional information display, display panels have changed more in appearance to better adapt to the overall structure and use requirements of the environment, resulting in profiled display panels. The profiled display panel is a display panel that is transformed into a special shape on the basis of a traditional display panel. The profiled display panel can be applied to electronic devices, such as glasses and in-vehicle central control. When there are display regions having different widths in the profiled display panel, the luminance difference between display regions having different width is easily recognized by human eyes, so that the visual effect of the profiled display panel is reduced, thereby affecting the user experience. Especially when the display regions having different widths are arranged adjacently, the user experience is worse.

SUMMARY

In a first aspect of the present disclosure, a display panel is provided. The display panel has a first region and a second region that are arranged along a first direction, and includes a plurality of sub-pixels. First sub-pixel groups are located in a first region of the display panel and arranged along a first direction, and at least one of the first sub-pixel groups includes at least two sub-pixels of the plurality of sub-pixels that are arranged along a second direction intersecting with the first direction. Second sub-pixel groups are located in a second region of the display panel and arranged along the first direction, and at least one of the second sub-pixel groups includes at least two sub-pixels of the plurality of sub-pixels that are arranged along the second direction. A number of the at least two sub-pixels in each of the first sub-pixel groups is greater than a number of the at least two sub-pixels in each of the second sub-pixel groups. Among the second sub-pixel groups, a number of the at least two sub-pixels in one of the second sub-pixel groups that is close to the first region is greater than a number of the at least two sub-pixels in one of the second sub-pixel groups that is away from the first region.

In a second aspect of the present disclosure, a display apparatus is provided. The display apparatus includes a display panel. The display panel has a first region and a second region that are arranged along a first direction, and includes a plurality of sub-pixels. First sub-pixel groups are located in a first region of the display panel and arranged along a first direction, and at least one of the first sub-pixel groups includes at least two sub-pixels of the plurality of sub-pixels that are arranged along a second direction intersecting with the first direction. Second sub-pixel groups are located in a second region of the display panel and arranged along the first direction, and at least one of the second sub-pixel groups includes at least two sub-pixels of the plurality of sub-pixels that are arranged along the second direction. A number of the at least two sub-pixels in each of the first sub-pixel groups is greater than a number of the at least two sub-pixels in each of the second sub-pixel groups. Among the second sub-pixel groups, a number of the at least two sub-pixels in one of the second sub-pixel groups that is close to the first region is greater than a number of the at least two sub-pixels in one of the second sub-pixel groups that is away from the first region.

BRIEF DESCRIPTION OF DRAWINGS

In order to more clearly illustrate technical solutions of embodiments of the present disclosure, the accompanying drawings used in the embodiments are briefly described below.

The drawings described below are merely some of the embodiments of the present disclosure. Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that the term "or" used in the context of the present disclosure is to describe a correlation relation of related objects, indicating that there can be three relations, e.g., A or B can indicate only A, both A and B, and only B.

In this specification, it should be understood that the terms "basically", "approximately", "roughly", "about", "generally" and "substantially" described in the claims and embodiments of this disclosure refer to a reasonable process operation range or tolerance range, which can be substantially agreed, rather than an exact value.

It should be understood that although the terms 'first', 'second' and 'third' can be used in the present disclosure to describe regions, sub-regions, sub-pixel groups, these regions, sub-regions, sub-pixel groups should not be limited to these terms. These terms are used only to distinguish regions, sub-regions, sub-pixel groups from each other. For example, without departing from the scope of the embodiments of the present disclosure, a first region can also be referred to as a second region. Similarly, the second region can also be referred to as the first region.

Figure 1:
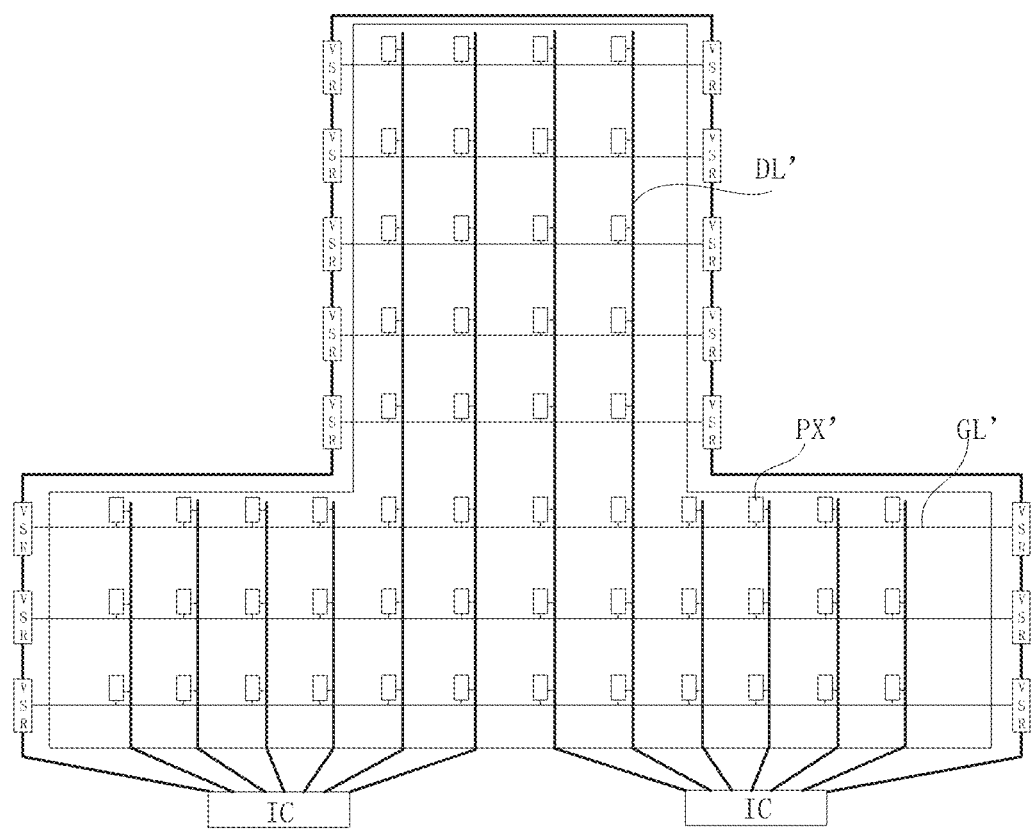
FIG. 1 is a schematic diagram showing a display panel in the related art.

FIG. 1 is a schematic diagram showing a display panel applied to in-vehicle central control.

The problems in the related art will be explained by taking the display panel including display regions having different display widths as shown in FIG. 1 as an example.

In the related art, the display panel includes two regions having different display widths from top to bottom. The upper display region has a narrower display width from left to right, while the lower display region has a wider display width from left to right. The display width of the display region from left to right varies greatly between the upper display region and the lower display region. Therefore, a scanning line GL' in the upper display region has a length significantly smaller than a length of a scanning line GL' located in the lower display region. In a process where the scanning signal output by a shifting register VSR is transmitting on the scanning line GL', due to an obvious difference between the length of the scanning lines GL', the voltage drop of the scanning signals on the scanning lines GL' in the two regions is significantly different and the parasitic capacitances of the scanning lines GL' and the number of the sub-pixels PXs' connected to the scanning lines GL' in the two regions are significantly different, resulting in different loads on the scanning line GL' in the two regions. The turn-on degrees of the transistors respectively electrically connected to the scanning lines GL' in the upper and lower regions are obviously different, resulting in different display luminance in the upper and lower regions.

In the related art, the display panel in the related art includes two regions having different display widths from left to right. A middle display region has a wider display width from top to bottom, while the display regions at two sides have a narrower display width from top to bottom, and there is a large display width variation from top to bottom between the middle display region and the middle of two display regions at two sides of the middle display region. The length of the data line DL' in the display region at two sides of the middle display region is significantly smaller than the length of the data line in the middle display region. In a process where the scanning signal output by an integrated circuit IC is transmitting on the data line DL', due to an obvious difference between the length of the data line DL', the voltage drops of the data signals on the data lines DL' in the adjacent left and right regions is significantly different, and the parasitic capacitance on the data line DL' and the number of sub-pixels PXs' connected to the data line DL' in the two regions are significantly different, resulting in different loads on the data line DL' in the adjacent left and right regions. The pixel electrodes electrically connected to the data lines DL' in the adjacent left and right regions receive different data signals, which in turn causes different display luminance in the adjacent left and right regions.

For the display image of the display panel shown in FIG. 1 having a grayscale of 127, the display luminance is simulated. When the number of the sub-pixels PXs connected to the scanning line GL' in the lower display region is twice the number of the sub-pixels PXs connected to the scanning line GL' in the upper display region and the number of the sub-pixels PXs connected to the data lines DL' in the middle display region is twice the number of the sub-pixels PXs connected to the data lines DL' in the display regions at two sides of the middle display region, the difference in display luminance between the upper and lower regions can reach 18%, which causes an apparent split screen occurring in the upper and lower regions, and the difference in display luminance between the adjacent left and right regions can reach 10%, which causes an apparent split screen occurring in the adjacent left and right regions.

In order to achieve a profiled display, a form of splicing at least two display panels can also be adopted. However, since the optical and color parameters of at least two display panels are difficult to achieve consistency and there is a border between two adjacent display panels, a whole display effect is affected.

In view of this, the present disclosure provides a display panel and a display apparatus, which will be described below with reference to the drawings and embodiments.

Figure 2:
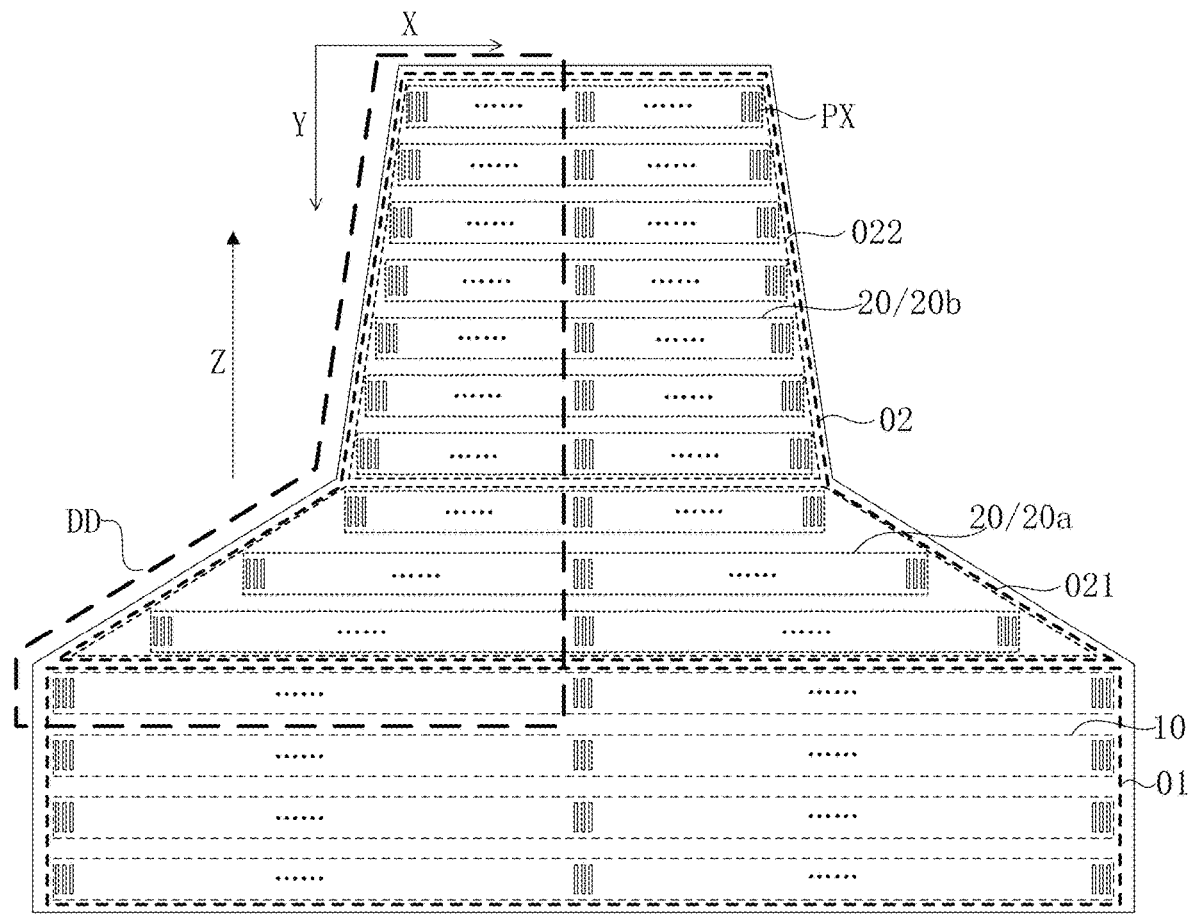
FIG. 2 is a schematic diagram showing a display panel according to an embodiment of the present disclosure.
Figure 3:
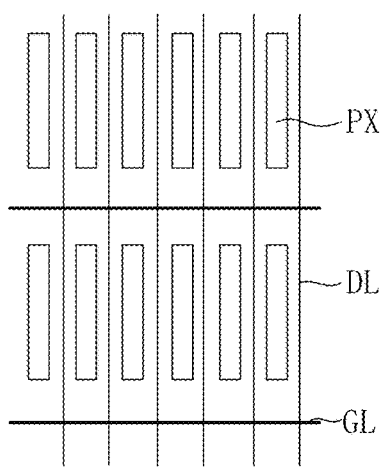
FIG. 3 is a partial enlarged view of the display panel shown in FIG. 2 according to an embodiment of the present disclosure.

FIG. 2 is a schematic diagram showing a display panel according to an embodiment of the present disclosure, and FIG. 3 is a partial enlarged view of the display panel shown in FIG. 2 according to an embodiment of the present disclosure.

As shown in FIG. 2 and FIG. 3, the display panel according to embodiments of the present disclosure includes multiple sub-pixels PXs. The sub-pixels PXs include at least two sub-pixels PXs having different colors in order to achieve color display. The sub-pixels PXs can also include sub-pixels PXs having only one color in order to achieve black-and-white display or single-color display. As shown in FIG. 3, the display panel further includes scanning lines GL and data lines DL, the scanning lines GL cross the data lines DL, and the sub-pixel PX can be a portion defined by the scanning line GL and the data line DL.

The sub-pixel PX can include an organic light-emitting device, a micro light-emitting diode, or liquid crystal molecules. That is, the display panel provided in embodiments of the present disclosure can be an organic light-emitting display panel, a micro light-emitting diode display panel, or a liquid crystal display panel.

As shown in FIG. 2, the display panel includes a first region 01 and a second region 02. The first region 01 and the second region 02 are arranged along a first direction Y.

First sub-pixel groups 10 are located in the first region 01. The first sub-pixel group 10 includes multiple sub-pixels PXs arranged along a second direction X. The sub-pixel groups 10 in the first region 01 are arranged along the first direction Y. The first direction Y intersects with the second direction X. For example, as shown in FIG. 2, sub-pixel rows arranged along a column direction are located in the first region 01 of the display panel, that is, one row of sub-pixels PXs in the first region 01 form one first sub-pixel group 10. The first direction Y and the second direction X can be a column direction and a row direction that are perpendicular to each other, respectively.

Second sub-pixel groups 20 are located in the second region 02. The second sub-pixel group 20 includes multiple sub-pixels PXs arranged along the second direction X. The second sub-pixel groups 20 in the second region 02 are arranged along the first direction Y. For example, as shown in FIG. 2, sub-pixel rows arranged in the column direction are located in the second region 02 of the display panel, that is, one row of sub-pixels PXs in the second region 02 form one second sub-pixel group 20.

The number of the sub-pixels PXs in the first sub-pixel group 10 is greater than the number of the sub-pixels PXs in the second sub-pixel group 20, that is, the number of the sub-pixels PXs in a same row in the first region 01 is greater than the number of the sub-pixels PXs in a same row in the second region 02. That is, the display panel provided by the present disclosure is a profiled display panel with varying display widths, and can be applied to the display in the in-vehicle field, wearable field, etc., for example, the display panel provided in the present disclosure can be used as in-vehicle central control.

In an embodiment, among multiple second sub-pixel groups 20 in the second region 02, the number of the sub-pixels PXs in one second sub-pixel group 20 close to the first region 01 is greater than the number of the sub-pixels PXs in another second sub-pixel group 20 away from the first region 01. That is, among the multiple second sub-pixel groups 20 in the second region 02, the farther the second sub-pixel group 20 from the first region 01, the smaller the number of the sub-pixels PXs in the second sub-pixel group 20.

In an embodiment, among the second sub-pixel groups 20 in the second region 02, the numbers of sub-pixels PXs in the second sub-pixel groups 20 are different from each other. In another embodiment, among the second sub-pixel groups 20 in the second region 02, the number of the sub-pixels PXs in one second sub-pixel group 20 is the same as the number of the sub-pixels PXs in another second sub-pixel group 20 adjacent to the one second sub-pixel group 20.

In an embodiment, the second region 02 includes a first sub-region 021 and a second sub-region 022. The first sub-region 021 is closer to the first region 01 than the second sub-region 022, i.e., the first sub-region 021 is located between the second sub-region 022 and the first region 01. In an embodiment, the number of the sub-pixels PXs in the second sub-pixel group 20 in the second sub-region 022 is smaller than the number of the sub-pixels PXs in the second sub-pixel group 20 in the first sub-region 021. The second sub-pixel group 20 in the first sub-region 021 can be a second sub-pixel group 20a. The second sub-pixel group 20 in the second sub-region 022 can be a second sub-pixel group 20b. The number of the sub-pixels PXs arranged along the second direction X and located in the second sub-pixel group 20a is greater than the number of the sub-pixels PXs arranged along the second direction X and located in the second sub-pixel group 20b.

In a direction Z from the first region 01 to the second region 02, a variation rate R1 of the numbers of the sub-pixels PXs in the second sub-pixel groups 20a in the first sub-region 021 is greater than a variation rate R2 of the numbers of the sub-pixels PXs in the second sub-pixel groups 20b in the second sub-region 022, i.e., R1>R2. That is, in the second region 02, along the direction Z gradually away from the first region 01, the numbers of the sub-pixels PXs in the second sub-pixel groups 20 are gradually decreased, and the variation rate of the sub-pixels PXs in the second sub-pixel group 20b is smaller than the variation rate of the sub-pixels PXs in the second sub-pixel group 20a.

As shown in FIG. 2, the first region 01 is disposed below the second region 02, and the first sub-region 021 is disposed below the second sub-region 022. Referring to FIG. 2, in the direction Z from bottom to top, the numbers of the sub-pixels PXs in the second sub-pixel groups 20a gradually decrease, and the numbers of the sub-pixels PXs in the second sub-pixel groups 20b gradually decrease. The variation rate R1 of the numbers of the sub-pixels PXs in second sub-pixel groups 20a is greater than the variation rate R2 of the numbers of the sub-pixels PXs in second sub-pixel groups 20b, i.e., R1>R2.

The variation rate of the number of the sub-pixels PXs in different second sub-pixel groups 20 can be represented by the variation number of the sub-pixels PXs, or a ratio of variation number of the sub-pixels PXs.

In an embodiment of the present disclosure, for two adjacent second sub-pixel groups 20 with different numbers of the sub-pixels PXs, the variation rate of the number of the sub-pixels PXs in different second sub-pixel groups 20 can be a difference between the number of the sub-pixels PXs in one of the two adjacent second sub-pixel groups 20 that is away from the first region 01 and the number of the sub-pixels PXs in the other one of the two adjacent second sub-pixel groups 20 that is close to the first region 01.

In an embodiment of the present disclosure, for two adjacent second sub-pixel groups 20 with different numbers of the sub-pixels PXs, the variation rate of the number of the sub-pixels PXs in different second sub-pixel groups 20 can be a ratio of a difference between the number of the sub-pixels PXs in one of the two adjacent second sub-pixel groups 20 that is away from the first region 01 and the number of the sub-pixels PXs in the other one of the two adjacent second sub-pixel groups 20 that is close to the first region 01 to the number of the sub-pixels PXs in the one of the two adjacent second sub-pixel groups 20 that is close to the first region 01.

In an embodiment of the present disclosure, a difference between the number of the sub-pixels PXs in one of two adjacent second sub-pixel groups 20a with different number of the sub-pixels PXs and the number of the sub-pixels PXs in the other one of the two adjacent second sub-pixel groups 20a is greater than a difference of the number of the sub-pixels PXs in one of two adjacent second sub-pixel groups 20b with different number of the sub-pixels PXs and the number of the sub-pixels PXs in the other one of the two adjacent second sub-pixel groups 20b.

The two adjacent second sub-pixel groups 20 with different number of the sub-pixels PXs means that the two second sub-pixel groups 20 respectively include different number of the sub-pixels PXs, and there is no other second sub-pixel group 20 with the number of the sub-pixels PXs different from each of the numbers of the sub-pixels PXs in the two adjacent second sub-pixel groups 20.

In an embodiment, there is no other second sub-pixel groups 20 between the two adjacent second sub-pixel groups 20.

In another embodiment, there is another second sub-pixel group 20 located between the two adjacent second sub-pixel groups 20, and the number of the sub-pixels PXs in the another second sub-pixel group 20 is equal to the number of the sub-pixels PXs in at least one of the two adjacent second sub-pixel groups 20. As a non-limiting example, the two second sub-pixel groups 20 include 1000 sub-pixels PXs and 900 sub-pixels PXs, respectively, and the another second sub-pixel group 20 between the two adjacent second sub-pixel groups 20 includes 1000 or 900 sub-pixels PXs.

In an embodiment of the present disclosure, if the number of the sub-pixels PXs in the first sub-pixel group 10 in the first region 01 is greater than the number of the sub-pixels PXs in the second sub-pixel group 20 in the second region 02, the display width of the first region 01 of the display panel is greater than the display width of the second region 02. The numbers of the sub-pixels PXs in multiple second sub-pixel groups 20 in the second region 02 that are arranged in the direction Z from the first region 01 to the second region 02 gradually decrease, and the lengths of multiple signal lines arranged in the second region 02 gradually decrease, thereby avoiding obvious difference in display luminance caused by abrupt change of the load of the signal lines in the second region 02 and the first region 01. The signal line in the present disclosure refers to at least one of a scanning line, a data line, or a fixed potential line.

In an embodiment, the first sub-region 021 of the second region 02 is closer to the first region 01 than the second sub-region 022; and in the direction Z from the first region 01 to the second region 02, the numbers of the sub-pixels PXs in multiple second sub-pixel groups 20a in the first sub-region 021 decrease quicker than a decrease rate of the numbers of the sub-pixels PXs in multiple second sub-pixel groups 20b in the second sub-region 022. On the one hand, an obvious difference in display luminance at the junction between the second region 02 and the first region 01 can be avoided; on the other hand, the display width of the second region 02 can quickly reach a preset width.

In an embodiment of the present disclosure, as shown in FIG. 2, if the numbers of the sub-pixels PXs in all first sub-pixel groups 10 in the first region 01 are the same, the first region 01 can be a display region with equal widths.

In an embodiment of the present disclosure, the number m1 of the sub-pixels PXs in one of the two adjacent second sub-pixel groups 20 with different numbers of the sub-pixels PXs and the number m2 of the sub-pixels PXs in the other one of the two adjacent second sub-pixel groups 20 satisfy m2≤m1*0.95. That is to say, the difference in the numbers of the sub-pixels PXs in the two adjacent second sub-pixel groups 20 different number of the sub-pixels PXs exceeds 5%, or, the number of the sub-pixels PXs in one of the two adjacent second sub-pixel groups 20 is smaller than the number of the sub-pixels PXs in the other one of the two adjacent second sub-pixel groups 20 by more than 5%.

Therefore, in an embodiment, m2≤m1*0.9.

When the display widths of the two display regions of the display panel differ greatly, if relying on the conventional technology, the display luminance difference of the two display regions of the display panel can reach more than 5%, for example, 10%, the luminance difference is easily recognized by the human eye. When the display widths of the two display regions of the same display panel differs greatly, if adopting the technical solution of the present disclosure, the luminance difference of the two display regions of the display panel is gradually changed and is not prone to be visible to human eyes.

In an embodiment, in the display panel, multiple sub-pixels PXs are actually repeatedly arranged in unit of pixel. The pixel is a unit that emits white light, and includes at least three sub-pixels PXs with different colors. For example, the pixel includes a red sub-pixel, a green sub-pixel, and a blue sub-pixel, or includes a red sub-pixel, a green sub-pixel, a blue sub-pixel, and a white sub-pixel. In an embodiment of the present disclosure, the difference between the number of the pixels in the two adjacent second sub-pixel groups 20 with different number of the sub-pixels PXs exceeds 5%, or, the number of the pixels in one of the two adjacent second sub-pixel groups 20 is less than the number of the pixels in the other one of the two adjacent second sub-pixel groups by 5%. In an embodiment, the difference between the numbers of the pixels PXs in two adjacent second sub-pixel groups 20 is smaller than or equal to 500 and greater than or equal to 20.

Figure 4:
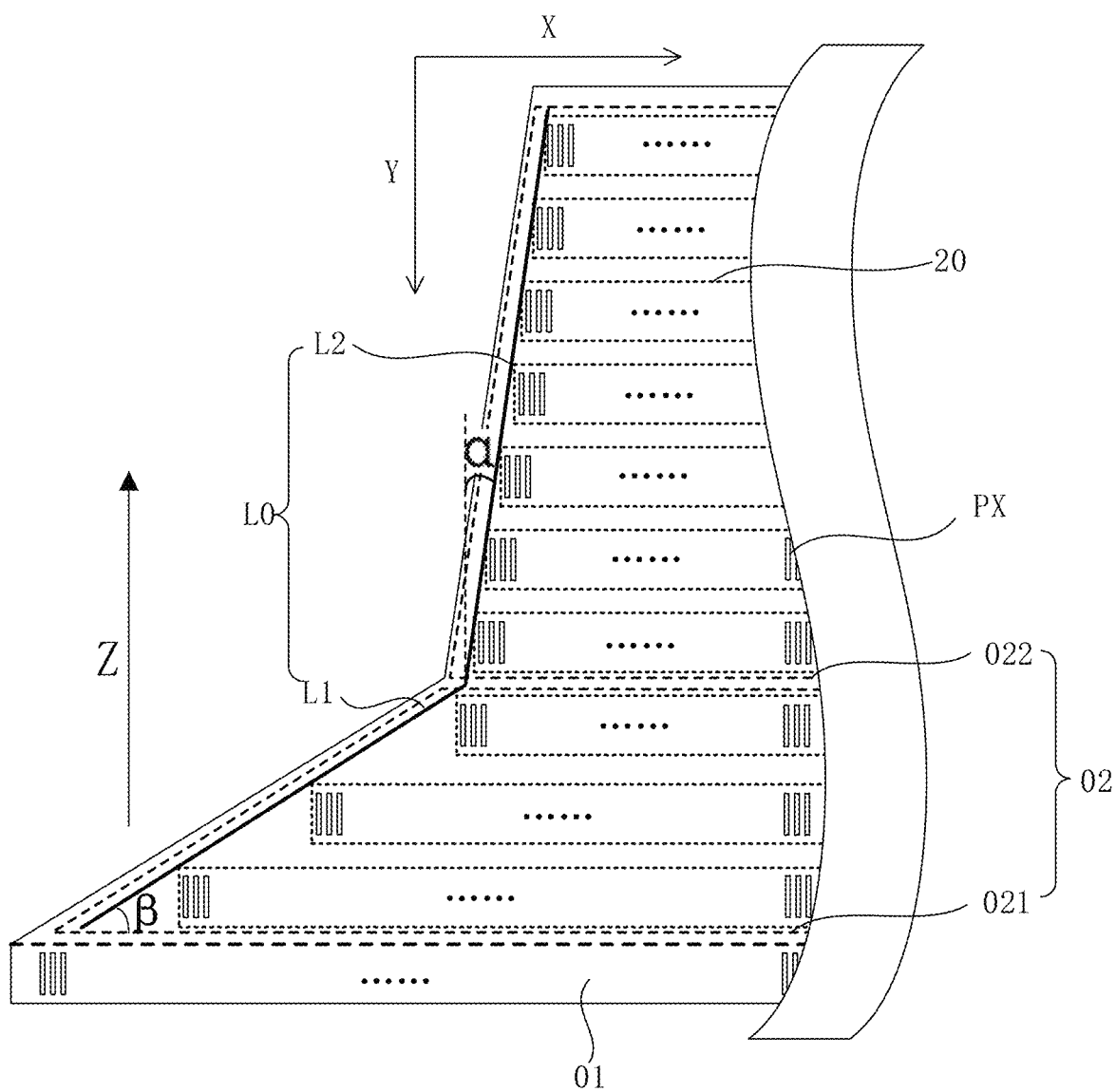
FIG. 4 is a partial schematic diagram showing a DD region of the display panel shown in FIG. 2 according to an embodiment of the present disclosure.

FIG. 4 is a partial schematic diagram showing a DD region of the display panel shown in FIG. 2 according to an embodiment of the present disclosure.

As shown in FIG. 4, the second region 02 includes at least one bevel edge L0. For any one bevel edge L0, the sub-pixels PXs located in the second region 02 each include a portion, and the portions of these sub-pixels PXs are located at a same side of the bevel edge L0. In an embodiment, the sub-pixels PXs located in the second region 02 are all located at a same side of the bevel edge L0. In another embodiment, one of the sub-pixels located in the second region 02 and close to the outermost periphery of the bevel edge L0 has one part located at one side of the bevel edge L0, and another part located at another side of the bevel edge L0.

In an embodiment, a minimum angle formed between the bevel edge L0 and the first direction Y is a first angle α, where α≥0.5°; or, a minimum angle formed between the bevel edge L0 and the second direction X is a second angle β, where β>0.5°. When the bevel edge L0 satisfies the angle range, the grayscale variation generated between the first region 01 and the second region 02 cannot be recognized by human eyes.

The bevel edge is a line obtained by smoothing the boundary lines of different regions of the display panel. When the sub-pixels PXs in the second region 02 are all used for display, the boundary line between the display region corresponding to the second region 02 and the non-display region at a same side of the display region can be regarded as the bevel edge L0. When some of the sub-pixels PXs close to the edge in the second region 02 are not used for display, a line obtained by smoothing the connection line between the sub-pixels PXs located at a same side in the second region 02 can be regarded as the bevel edge L0.

When the bevel edge L0 includes different parts with different angles, a minimum angle formed between the first direction Y and a first part of the bevel edge L0, which is the first angle α, is smaller than a minimum angle formed between the first direction Y and another part of the bevel edge L0 and smaller than a minimum angle formed between the second direction X and the first part of the bevel edge L0, where α≥0.5°; and a minimum angle formed between the second direction X and a second part of the bevel edge L0, which is the second angle β, is smaller than a minimum angle formed between the second direction X and other part of the bevel edge L0 and smaller than a minimum angle formed between the first direction Y and the second part of the bevel edge L0, where β≥0.5°.

As shown in FIG. 2 and FIG. 4, when the bevel edge L0 includes a first edge L1 and a second edge L2 that are connected to each other and respectively have different angles, the first edge L1 is adjacent to the first sub-region 021, and the second edge L2 is adjacent to the second sub-region 022. A minimum angle formed between the first edge L1 and the second direction X is the second angle β, and a minimum angle formed between the second edge L2 and the first direction Y is the first angle α. The minimum angle formed between the first edge L1 and the second direction X is smaller than the minimum angle formed between the second edge L2 and the second direction X, and the minimum angle formed between the second edge L2 and the first direction Y is smaller than the minimum angle formed between the first edge L1 and the first direction Y.

In an embodiment of the present disclosure, 5°≥α≥0.5°, 5°≥β≥0.5°. When the angles of the first edge L1 and the second edge L2 satisfy the above relationship, on the one hand, the display panel can have two adjacent regions with a large difference in display width, for example, the display panel is in a shape of "T" or "L"; on the other hand, the grayscale variation between two adjacent regions cannot be recognized by the human eye.

When the length of the second region 02 along the first direction Y is relatively long, the first angle α between the second edge L2 corresponding to the second sub-region 022 and the first direction Y can satisfy 2.5°≥α≥0.5°.

Figure 5:
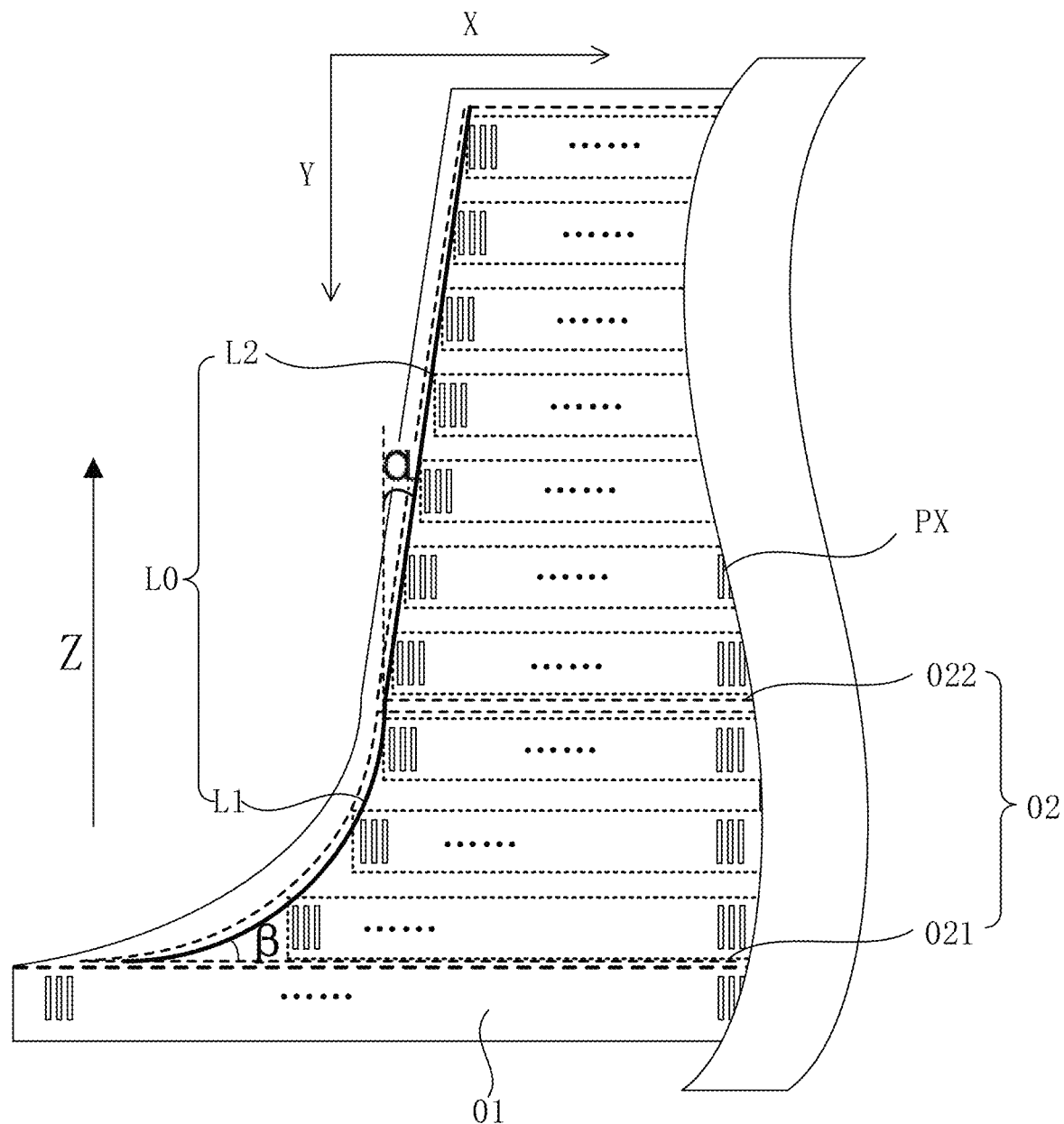
FIG. 5 is a partial schematic diagram showing the DD region of the display panel shown in FIG. 2 according to another embodiment of the present disclosure.
Figure 6:
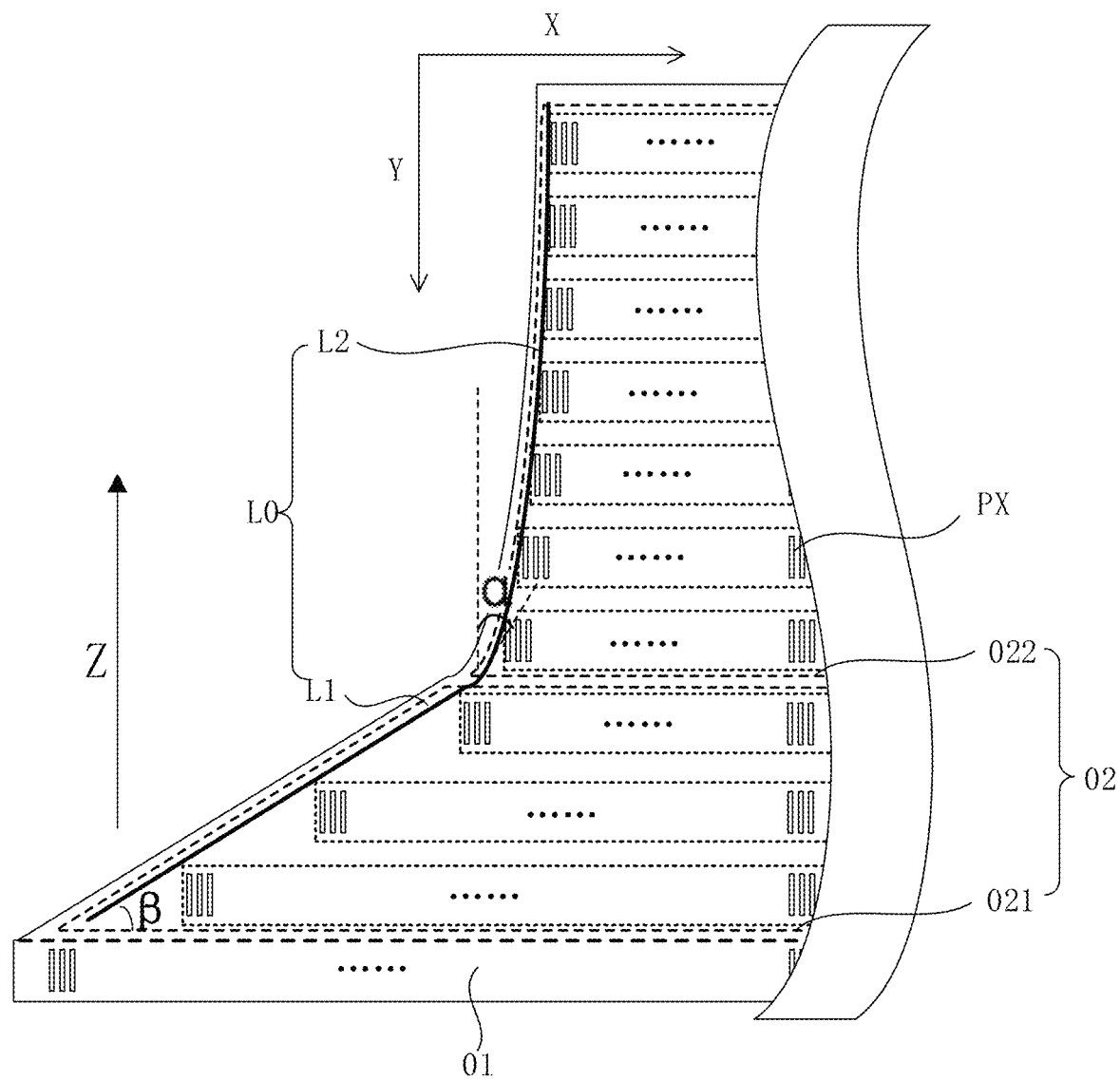
FIG. 6 is a partial schematic diagram showing the DD region of the display panel shown in FIG. 2 according to another embodiment of the present disclosure.

FIG. 5 is a partial schematic diagram showing the DD region of the display panel shown in FIG. 2 according to another embodiment of the present disclosure, and FIG. 6 is a partial schematic diagram showing the DD region of the display panel shown in FIG. 2 according to another embodiment of the present disclosure.

In an embodiment of the present disclosure, as shown in FIG. 2, and FIG. 4 to FIG. 6, variation rates of the numbers of the sub-pixels PXs in the second sub-pixel groups 20 in the first sub-region 021 are of a same fixed value; or, variation rates of the numbers of the sub-pixels PXs in the second sub-pixel groups 20 in the second sub-region 022 are of a same fixed value.

In an embodiment, as shown in FIG. 4 to FIG. 6, the bevel edge L0 includes a first edge L1 and a second edge L2 that are connected to each other. The first edge L1 is adjacent to the first sub-region 021. The second edge L2 is adjacent to the second sub-region 022. The first edge L1 or the second edge L2 are linear.

In an embodiment of the present disclosure, as shown in FIG. 2 and FIG. 4, the variation rates of the numbers of the sub-pixels PXs in the second sub-pixel groups 20 in the first sub-region 021 are of a same fixed value, and the variation rates of the number of the sub-pixels PXs in the second sub-pixel groups 20 in the second sub-region 022 are of a same fixed value. That is, in the first sub-region 021, the difference between the numbers of the sub-pixels PXs in two adjacent second sub-pixel groups 20 having different number of the sub-pixels PXs is the same as the difference between the numbers of the sub-pixels PXs in another two adjacent second sub-pixel groups 20 having different number of the sub-pixels PXs. In the second sub-region 022, the difference between the numbers of the sub-pixels PXs in two adjacent second sub-pixel groups 20 having different number of the sub-pixels PXs is the same as the difference between the numbers of the sub-pixels PXs in another two adjacent second sub-pixel groups 20 having different number of the sub-pixels PXs.

That is to say, in a direction Z from bottom to top, the numbers of the sub-pixels PXs in different rows in the first sub-region 021 decrease by a same amount, and the numbers of the sub-pixels PXs in different rows in the second sub-region 022 decrease by a same amount.

In an embodiment of the present disclosure, as shown in FIG. 4, the bevel edge L0 includes the first edge L1 and the second edge L2 that are connected to each other. When the first edge L1 is adjacent to the first sub-region 021 and the second edge L2 is adjacent to the second sub-region 022, the first edge L1 and the second edge L2 are both linear and are not collinear.

Figure 7:
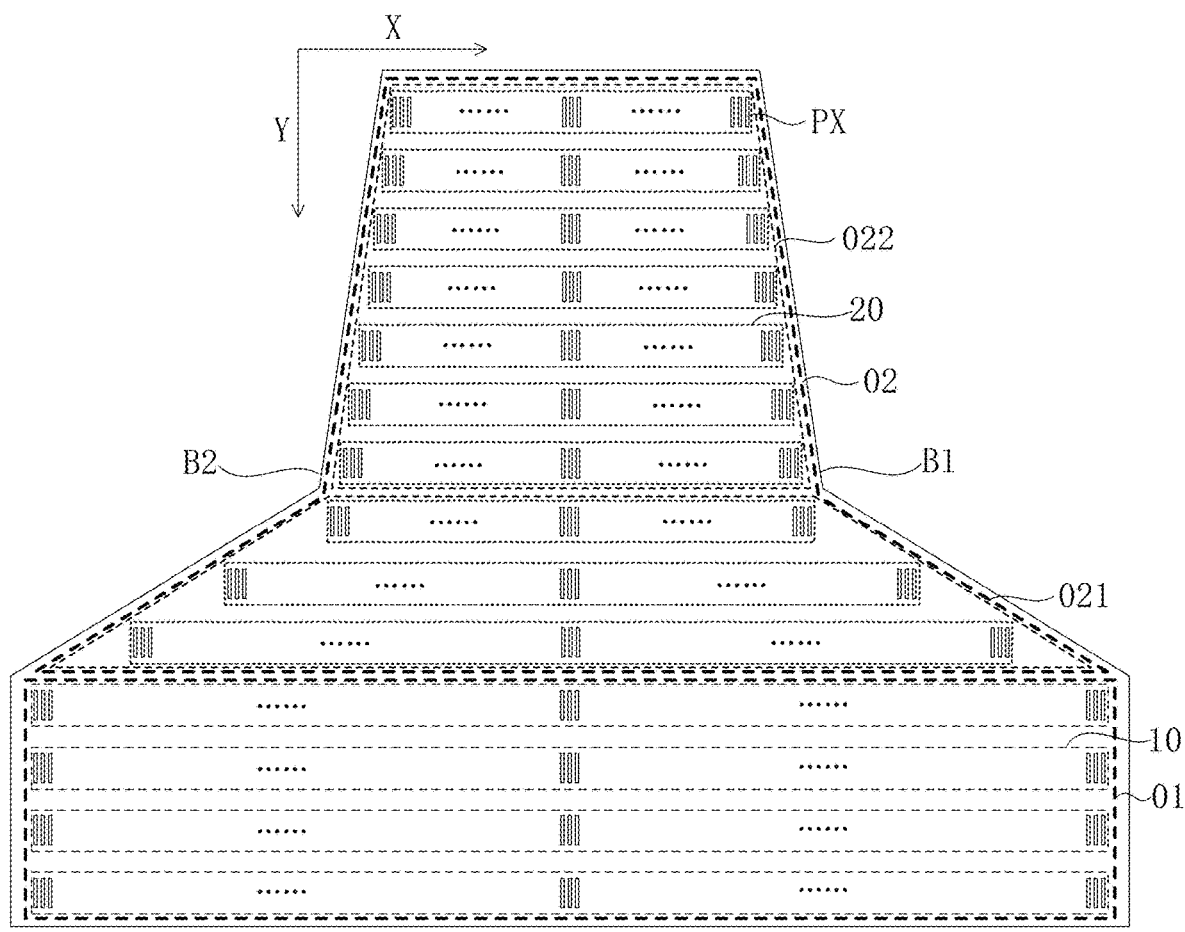
FIG. 7 is a schematic diagram showing a display panel according to another embodiment of the present disclosure.

The differences between the numbers of the sub-pixels X in different adjacent rows are basically the same, and load differences of the corresponding adjacent signal lines with the same function are also basically the same, so that the display luminance differences of different adjacent rows are basically the same, so the display luminance differences between different adjacent rows are basically consistent, so that the luminance in different regions of the display panel is uniformly changed to avoid a sudden change in luminance. In an embodiment of the present disclosure, as shown in FIG. 6 and FIG. 7, in the direction Z from the first region 01 to the second region 02, the variation rates of the numbers of the sub-pixels in the second sub-pixel groups 20 in the first sub-region 021 gradually decrease; or in the direction Z from the first region 01 to the second region 02, the variation rates of the numbers of the sub-pixels PXs in the second sub-pixel groups 20 in the second sub-region 022 gradually decrease.

In an embodiment of the present disclosure, in the first sub-region 021 or the second sub-region 022, the difference between the numbers of the sub-pixels PXs in the adjacent second sub-pixel groups 20 close to the first region 01 is relatively large, and the difference between the numbers of the sub-pixels PXs in the adjacent second sub-pixel groups 20 away from the first region 01 is relatively small. By quickly reducing the numbers of the sub-pixels PXs in multiple rows of the second region 02 close to the first region 01, it is possible to achieve the profiled display (e.g., a "T"-shaped display) as soon as possible. By slowly reducing the numbers of the sub-pixels PXs in multiple rows of the second region 02 away from the first region 01, the second region 02 has a display width significant different from the first region 01, and at the same time, the display width of the second region 02 can be substantially the same as the display width of the second sub-region 022, thereby avoiding excessively wide of the non-display region where some of the sub-pixels PXs in the second region 02 are located.

In an embodiment of the present disclosure, as shown in FIG. 5, the variation rates of the numbers of the sub-pixels PXs in the second sub-pixel groups 20 in the first sub-region 021 can be of different values, and the farther from the first region 01, the smaller the variation rate of the numbers of the sub-pixels PXs is in the adjacent second sub-pixel groups 20. In the first sub-region 021, the difference between the numbers of the sub-pixels PXs in two adjacent second sub-pixel groups 20 that are close to the first region 01 and include different numbers of the sub-pixels PXs is greater than the difference between the numbers of the sub-pixels PXs in another two adjacent second sub-pixel groups 20 that are away from the first region 01 and include different numbers of the sub-pixels PXs.

In an embodiment of the present disclosure, as shown in FIG. 6, the variation rates of the numbers of the sub-pixels PXs in multiple second sub-pixel groups 20 in the second sub-region 022 can have different values, and the farther from the first region 01, the smaller the variation rate of the numbers of the sub-pixels PXs. In the second sub-region 022, the difference between the numbers of the sub-pixels PXs in two adjacent second sub-pixel groups 20 that are close to the first region 01 and include different numbers of the sub-pixels PXs is greater than the difference between the numbers of the sub-pixels PXs in another two adjacent second sub-pixel groups 20 that are away from the first region 01 and include different number of the sub-pixels PXs.

In an embodiment of the present disclosure, as shown in FIG. 5 and FIG. 6, the bevel edge L0 includes a first edge L1 and a second edge L2 that are connected to each other. When the first edge L1 is adjacent to the first sub-region 021 and the second edge L2 is adjacent to the second sub-region 022, one of the first edge L1 and the second edge L2 has an arc shape, and the other one of the first edge L1 and the second edge L2 has a straight-line shape.

In an embodiment of the present disclosure, in a direction Z from a first region 01 to a second region 02, the variation rates of the numbers of the sub-pixels PXs in the second sub-pixel groups 20 in the first sub-region 021 gradually decrease, and the variation rates of the numbers of the sub-pixels PXs in the second sub-pixel groups 20 in the second sub-region 022 are of a same fixed value. In this embodiment of the present disclosure, the differences in the numbers of the sub-pixels PXs in the second sub-pixel groups 20 that are closer to the second sub-region 022 in the first sub-region 021 gradually decrease, so that when the second sub-pixel group 20 in the first sub-region 021 is closer to the second sub-region 022, the number of the sub-pixels PXs in this second sub-pixel group 20 in the first sub-region 021 is closer to the number of the sub-pixels PXs in the second sub-pixel group 20 in the second sub-region 022.

That is, in an embodiment of the present disclosure, as shown in FIG. 5, in the first sub-region 021, the difference between numbers of sub-pixels PXs in two adjacent second sub-pixel groups 20 that are close to the first region 01 and include different numbers of the sub-pixels PXs is greater than the difference between numbers of sub-pixels PXs in another two adjacent second sub-pixel groups 20 that are away from the first region 01 and include different numbers of the sub-pixels PXs. In the second sub-region 022, the difference between numbers of sub-pixels PXs in two adjacent second sub-pixel groups 20 that include different numbers of the sub-pixels PXs is equal to the difference between numbers of the sub-pixels PXs in another two adjacent second sub-pixel groups 20 that include different numbers of the sub-pixels PXs.

In an embodiment of the present disclosure, as shown in FIG. 5, the bevel edge L0 includes a first edge L1 and a second edge L2 that are connected to each other. When the first edge L1 is adjacent to the first sub-region 021 and the second edge L2 is adjacent to the second sub-region 022, the first edge L1 is in an arc shape protruding toward the second region 02, and the second edge L2 has a straight-line shape. In an embodiment, the first edge L1 close to the first region 01 has an arc shape protruding toward the second region 02, so the variation rates of the numbers of the sub-pixels PXs of the second sub-pixel groups 20 close to the first edge L1 gradually decrease along the direction Z away from the first region 01. On the one hand, the variation rate of the numbers of the sub-pixels PXs of the second sub-pixel groups 20 is significantly changed at a position close to the first region 01, so that the number of the sub-pixels PXs in the second sub-pixel groups 20 is changed to the number of the sub-pixels PXs in the second sub-pixel group 20 in the second sub-region 022 as quickly as possible. On the other hand, since the number of the sub-pixels PXs in the second sub-pixel group 20 close to the first region 01 in the first sub-region 021 is relatively large, and the load is relatively large, when the numbers of the sub-pixels PXs in the second sub-pixel groups 20 are changed relatively large, the change in the load can also be relatively smooth.

In another embodiment of the present disclosure, as shown in FIG. 6, the bevel edge L0 includes a first edge L1 and a second edge L2 that are connected to each other. When the first edge L1 is adjacent to the first sub-region 021 and the second edge L2 is adjacent to the second sub-region 022, the first edge L1 has a straight-line shape, and the second edge L2 is in an arc shape protruding toward the second region 02. In an embodiment, the second sub-region 022 can be a region with a narrow display width in the display panel. By setting the second edge L2 to have an arc shape, the variation rates of the sub-pixels PXs in the second sub-region 022 change relatively slowly row by row, that is, the second edge L2 is a gentle edge. When some of the sub-pixels PXs close to the second edge L2 is located in the non-display region, the width of the non-display region where the second edge L2 is located is relatively small.

When the first edge L1 has an arc shape, the minimum angle formed between the first edge L1 and the second direction X refers to the minimum angle formed between the tangent corresponding to each point on the first edge L1 and the second direction X, which is usually the minimum angle formed between the tangent corresponding to the point close to the first region 01 on the first edge L1 and the second direction X. When the second edge L2 has an arc shape, the minimum angle formed between the second edge L2 and first direction Y refers to the minimum angle formed between the tangent corresponding to each point on the second edge L2 and the second direction X, which is usually the minimum angle formed between the tangent corresponding to the point close to the first region 01 on the second edge L2 and the second direction X.

Figure 8:
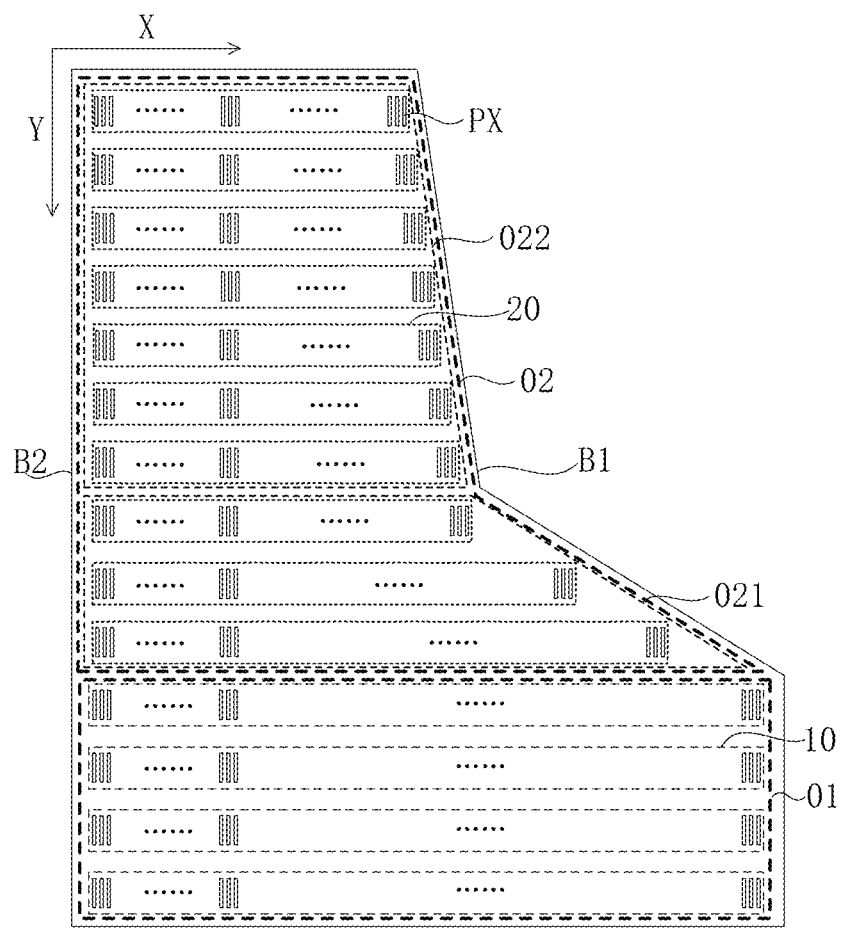
FIG. 8 is a schematic diagram showing a display panel according to another embodiment of the present disclosure.
Figure 9:
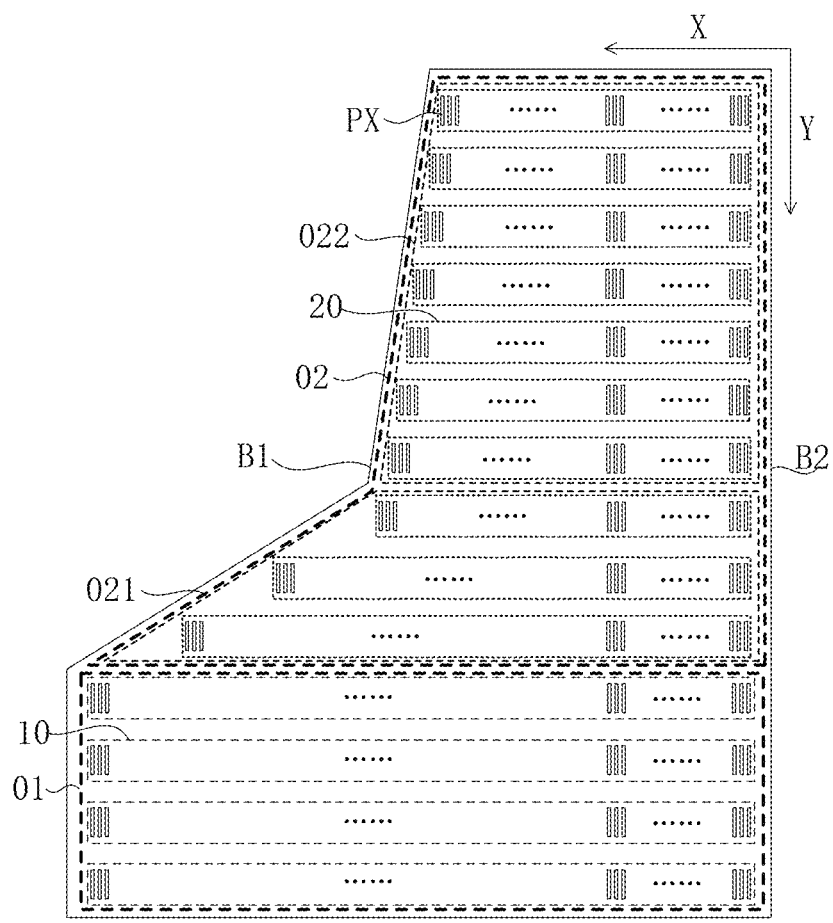
FIG. 9 is a schematic diagram showing a display panel according to another embodiment of the present disclosure.

FIG. 7 is a schematic diagram showing a display panel according to another embodiment of the present disclosure, FIG. 8 is a schematic diagram showing a display panel according to another embodiment of the present disclosure, and FIG. 9 is a schematic diagram showing a display panel according to another embodiment of the present disclosure.

In an embodiment of the present disclosure, as shown in FIG. 7, the display panel includes a first side B1 and a second side B2 that are opposite to each other along a second direction X. Among the sub-pixels PXs close to the first side B1, one sub-pixel PX located in the first sub-region 021 is not aligned with another sub-pixel PX located in the second sub-region 022 in the first direction Y. Among the sub-pixels PXs close to the second side B2, one sub-pixel PXs located in the first sub-region 021 is not aligned with another sub-pixel PX located in the second sub-region 022 in the first direction Y. That is, in a direction Z from the first region 021 to the second region 022, ends of multiple second sub-pixel groups 20 close to the first side B1 and ends of multiple second sub-pixel groups close to the second side B2 are both gradually shrunk inward synchronously. The ends of multiple second sub-pixel groups 20 are gradually shrunk toward the second side B2, and ends of multiple second sub-pixel groups 20 close to the second side B2 are gradually shrunk toward the first side B1.

In an embodiment of the present disclosure, as shown in FIG. 7, the first side B1 and the second side B2 are axisymmetric, that is, the second region 02 of the display panel has an axisymmetric shape.

That is, in the second region 02, sub-pixels PXs in different second sub-pixel groups 20 that are close to the first side B1 are not aligned with each other, and sub-pixels PXs in different second sub-pixel groups 20 that are close to the second side B1 are also not aligned with each other, i.e., the second region 02 includes at least two bevel edges L0 that are respectively close to the first side B1 and the second side B2.

In an embodiment of the present disclosure, as shown in FIG. 8 and FIG. 9, the display panel includes a first side B1 and a second side B2 that are opposite to each other along the second direction X. Among the sub-pixels PXs close to the first side B1, one sub-pixel PX located in the first sub-region 021 and another sub-pixel PX located in the second sub-region 022 are not aligned with each other in the first direction Y. Among the sub-pixels PXs close to the second side B2, one sub-pixel PX located in the first sub-region 021 is aligned with another sub-pixels PXs located in the second sub-region 022 in the first direction Y. That is, in the direction Z from the first region 021 to the second region 022, ends of multiple second sub-pixel groups 20 close to the first side B1 are gradually shrunk toward the second side B2, and ends of multiple second sub-pixel groups 20 close to the second side B2 are aligned with each other.

That is, in the second region 02, some sub-pixels PXs in different second sub-pixel groups 20 are not aligned with each other at the first side B1, and some sub-pixels PXs in different second sub-pixel groups 20 are aligned with each other at the second side B2. That is, the second region 02 includes at least one bevel edge L0 that is only close to the first side B1.

In an embodiment of the present disclosure, as shown in FIG. 8 and FIG. 9, sub-pixels PXs close to the second side B2 in the second region 02 are aligned with sub-pixels PXs close to the second side B2 in the first region 01 in the first direction Y.

Figure 10:
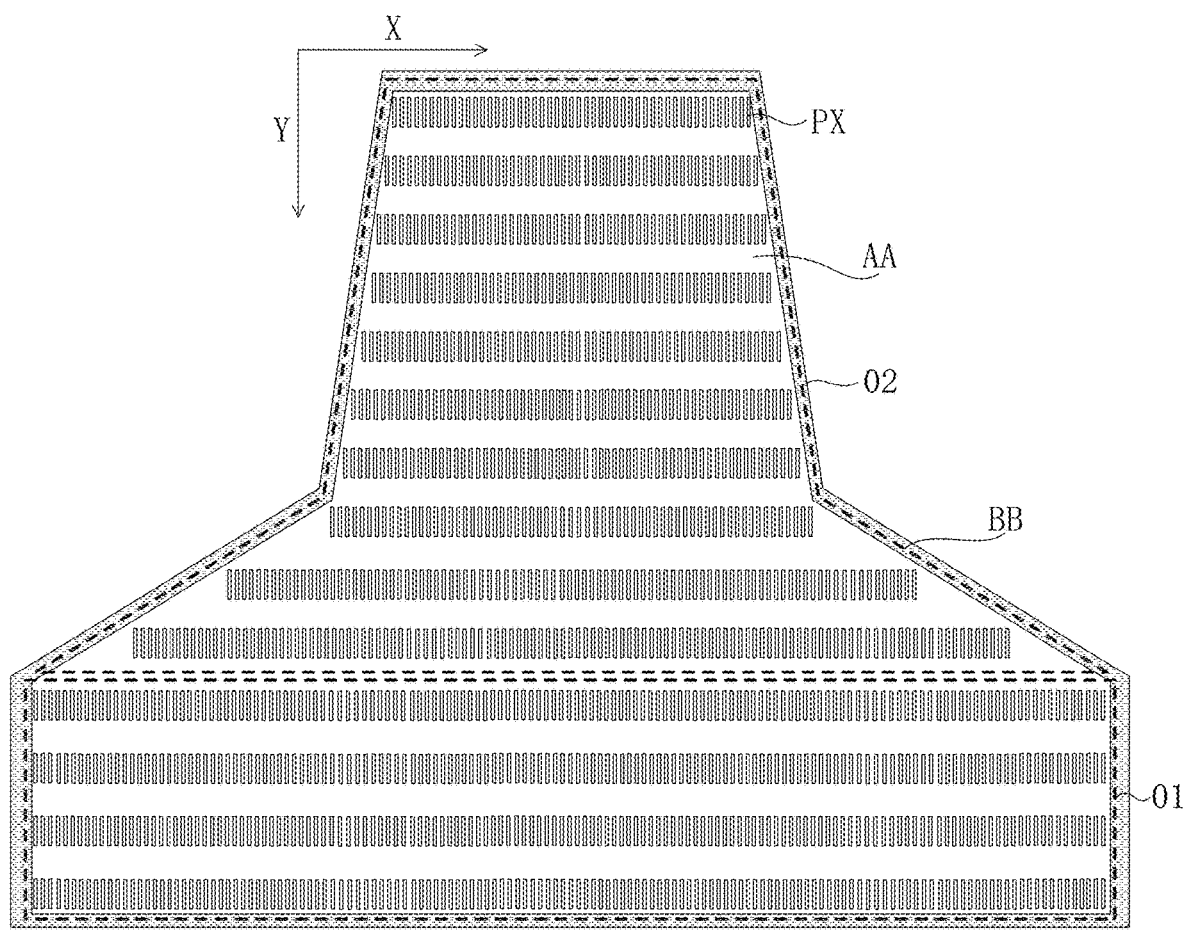
FIG. 10 is a schematic diagram showing a display panel according to another embodiment of the present disclosure.
Figure 11:
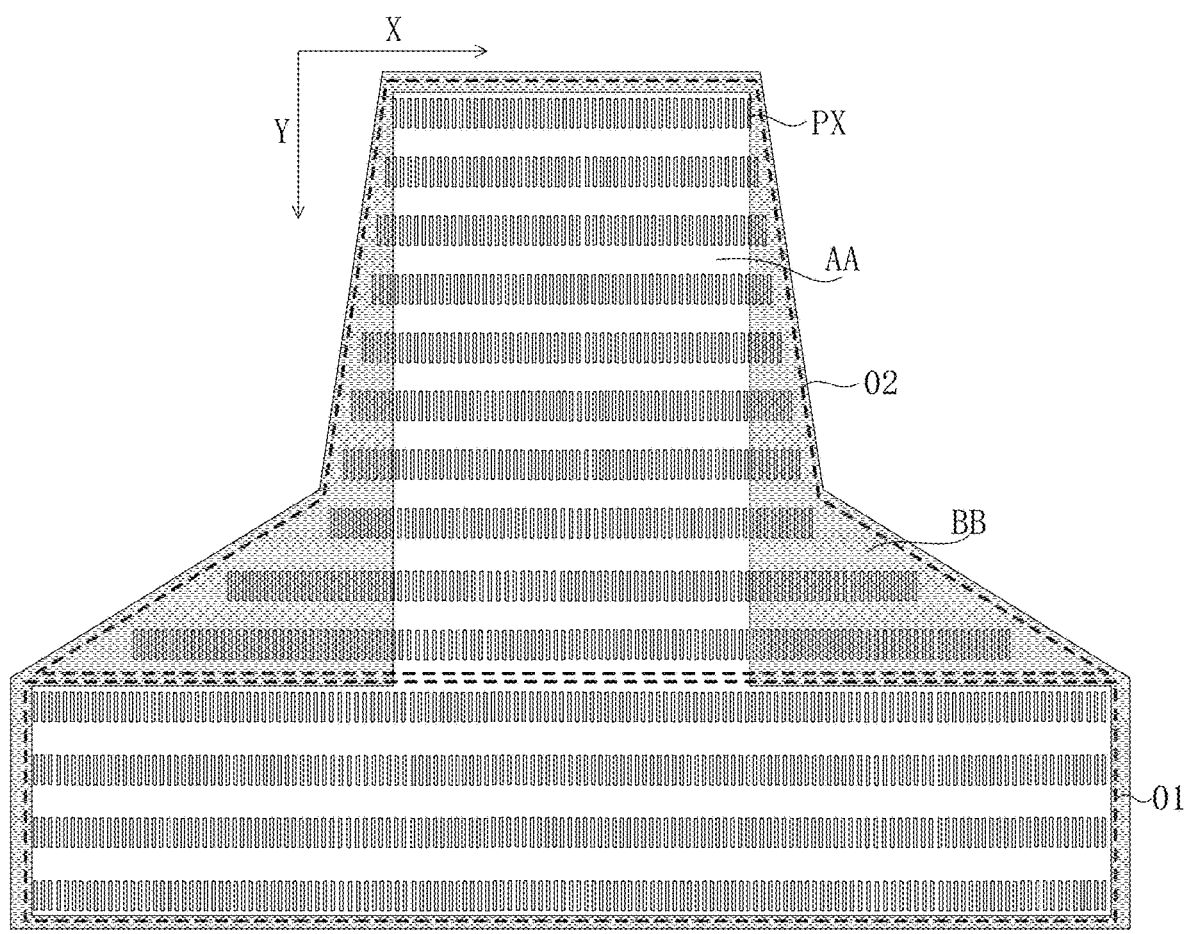
FIG. 11 is a schematic diagram showing a display panel according to another embodiment of the present disclosure.

FIG. 10 is a schematic diagram showing a display panel according to another embodiment of the present disclosure, and FIG. 11 is a schematic diagram showing a display panel according to another embodiment of the present disclosure.

As shown in FIG. 10 and FIG. 11, the display panel according to the embodiments of the present disclosure includes a display region AA and a non-display region BB. The display region AA is adjacent to the non-display region BB, and the non-display region BB surrounds the display region AA. The display region AA is a main region for display, and the non-display region BB is a border region which is not used for display. Black glue or black ink configured to shield light can be provided in the non-display region BB. In an embodiment, a black shielding structure can be provided on a color film for light shielding.

In an embodiment of the present disclosure, as shown in FIG. 10, the multiple sub-pixels PXs of the display panel each includes a portion located in the display region AA, that is, no sub-pixel PX is provided in the non-display region BB. That is to say, the sub-pixels PXs in the first region 01 and the second region 02 of the display panel are both used for display. Therefore, the profiled display screen has a uniform display luminance and a large screen-to-body ratio.

In an embodiment of the present disclosure, as shown in FIG. 11, the non-display region BB covers some of the sub-pixels PXs located in the second region 02, that is, the non-display region BB that is not used for display also covers some of the sub-pixels PXs located in the second region 02. That is, some of the sub-pixels PXs at the edge of the second region 02 are used to increase the load on the signal line in the second region 02, so that the loads on the signal lines in the first region 01 and the second region 02 are gradually changed, but these sub-pixels PXs are not used for display. By setting the sub-pixels PXs to be located in the non-display region BB, the large display luminance difference caused by different loads can be reduced. The non-display region can be provided to meet user requirements for different display shapes, such as a "T" shape display or an "L" shape display.

Figure 12:
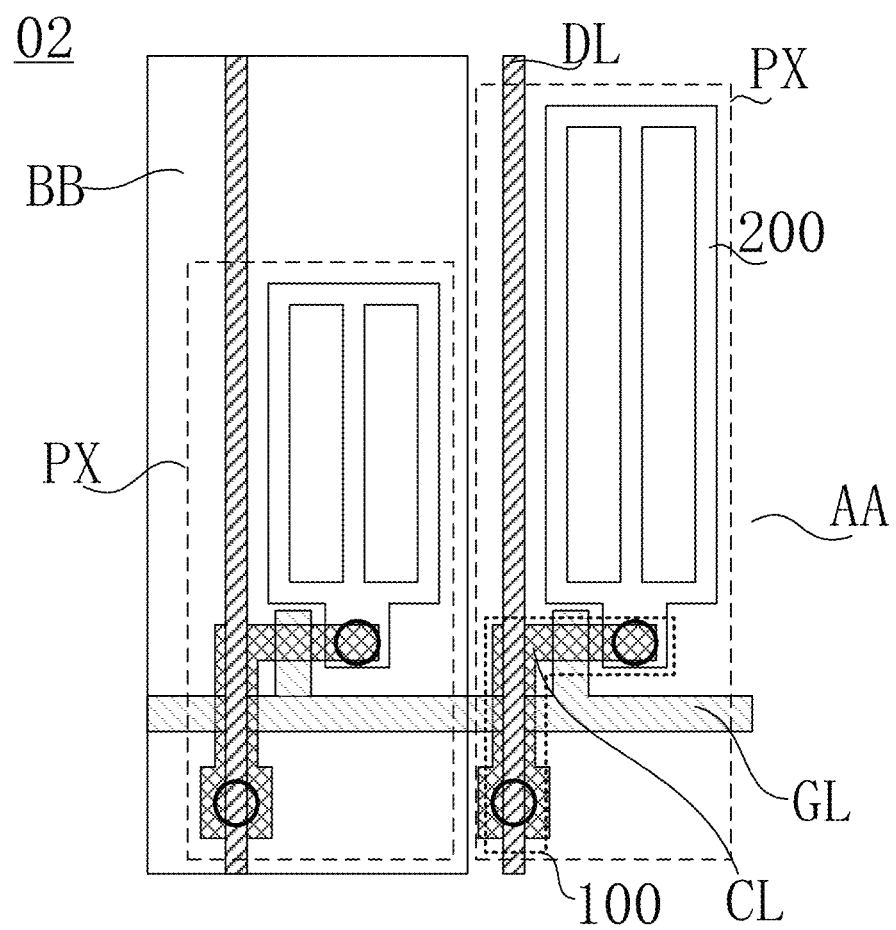
FIG. 12 is a partial schematic diagram showing a display panel according to another embodiment of the present disclosure.
Figure 13:
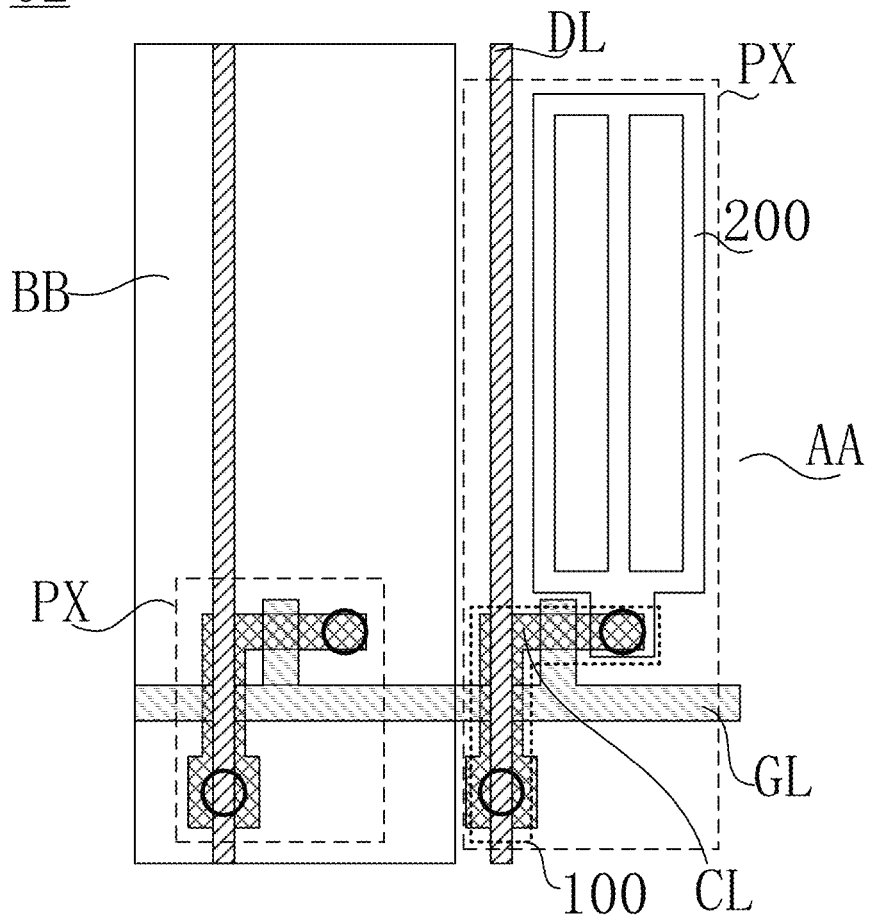
FIG. 13 is a partial schematic diagram showing a display panel according to another embodiment of the present disclosure.
Figure 14:
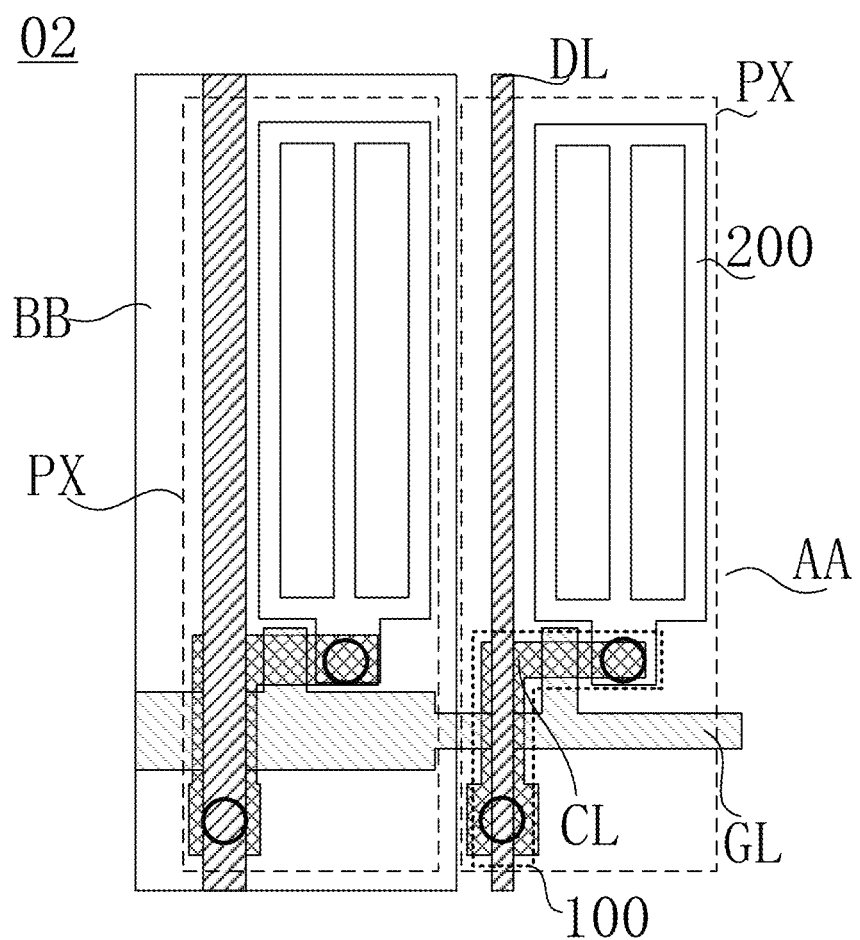
FIG. 14 is a partial schematic diagram showing a display panel according to another embodiment of the present disclosure.
Figure 15:
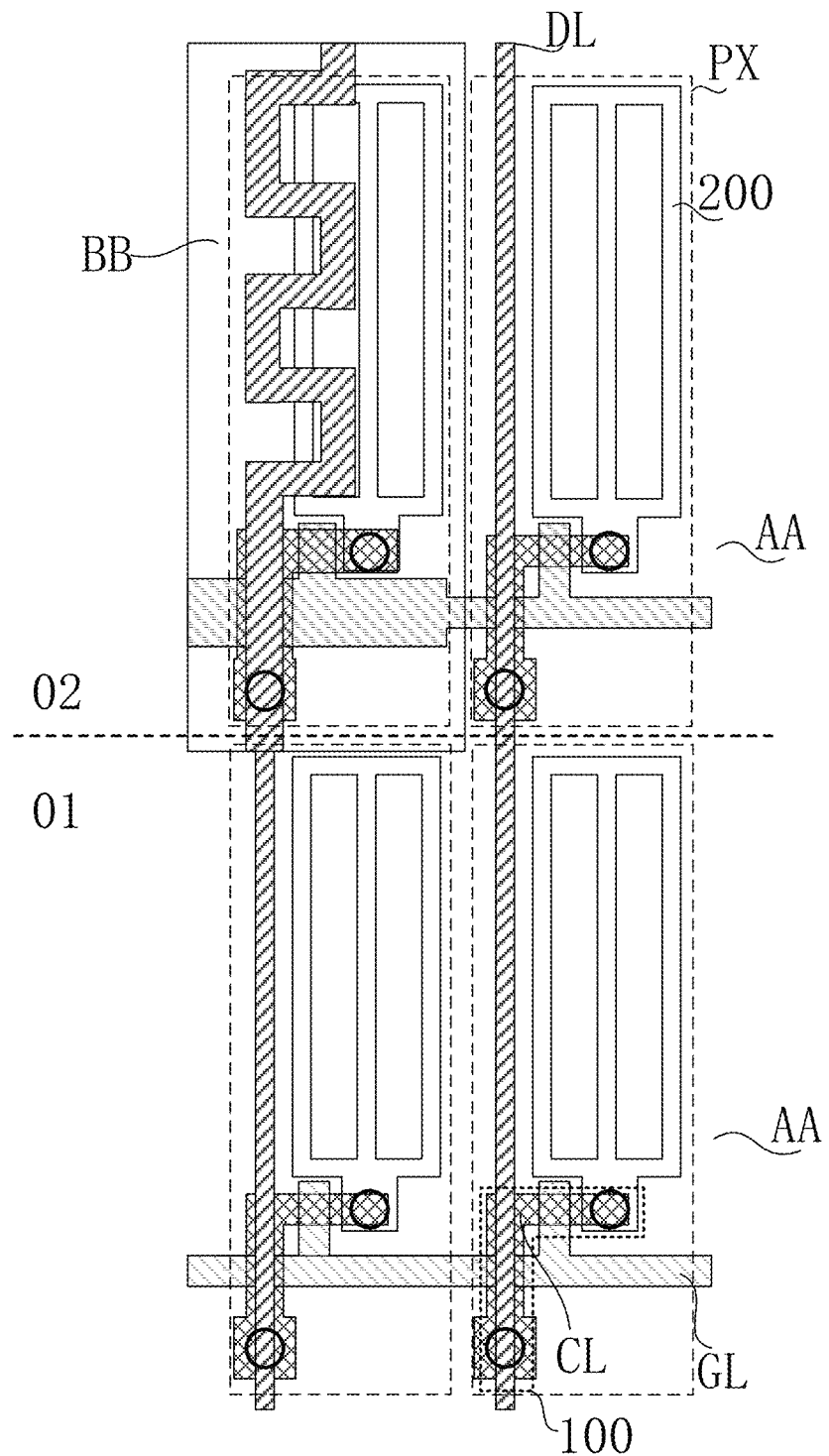
FIG. 15 is a partial schematic diagram showing a display panel according to another embodiment of the present disclosure.
Figure 16:
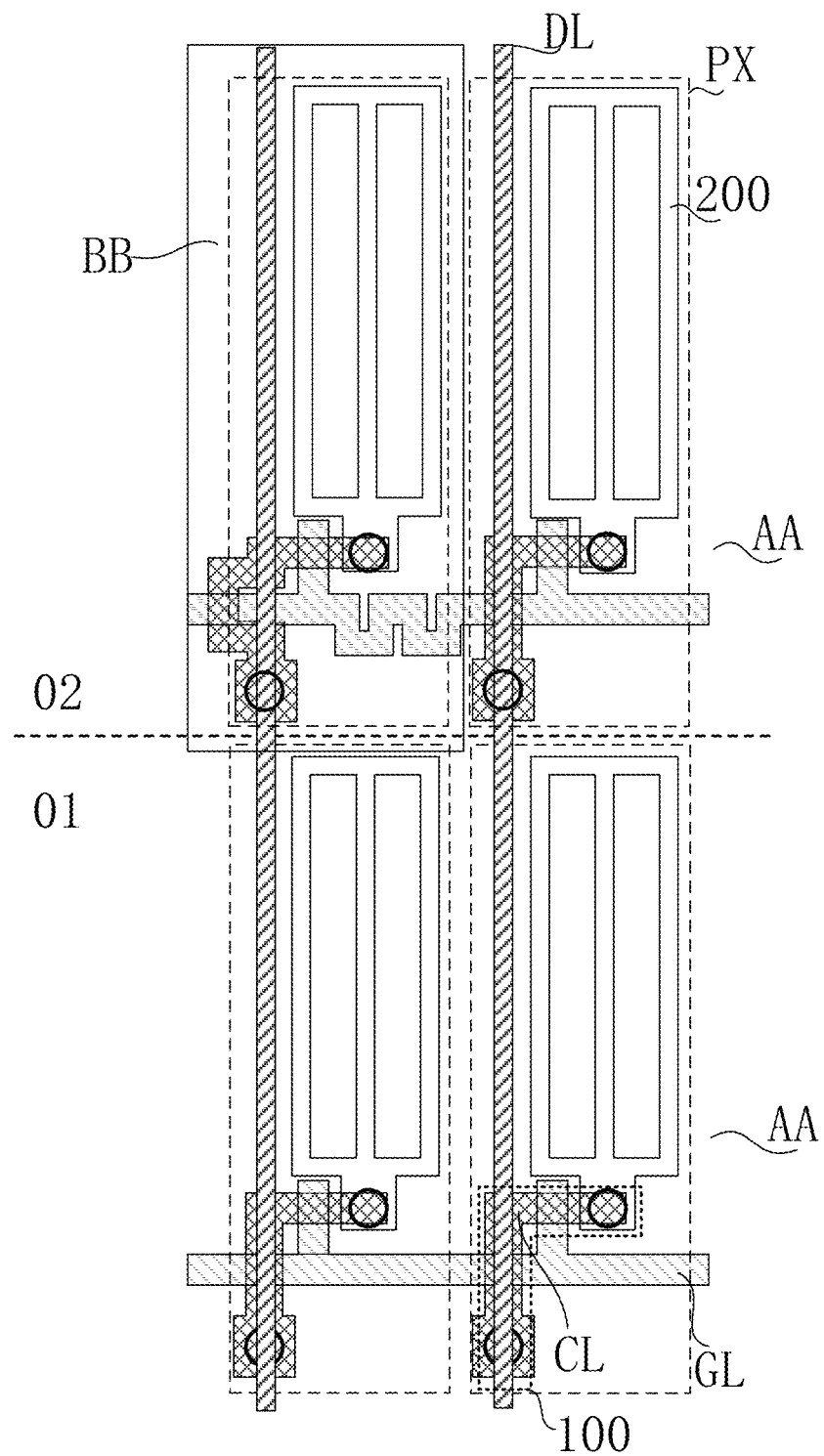
FIG. 16 is a partial schematic diagram showing a display panel according to another embodiment of the present disclosure.

FIG. 12 is a partial schematic diagram showing a display panel according to another embodiment of the present disclosure; FIG. 13 is a partial schematic diagram showing a display panel according to another embodiment of the present disclosure; FIG. 14 is a partial schematic diagram showing a display panel according to another embodiment of the present disclosure; FIG. 15 is a partial schematic diagram showing a display panel according to another embodiment of the present disclosure; and FIG. 16 is a partial schematic diagram showing a display panel according to another embodiment of the present disclosure.

In an embodiment of the present disclosure, as shown in FIG. 12, the sub-pixels PXs of the display panel each include a pixel electrode 200. An area of the pixel electrode 200 of the sub-pixel PX located in the non-display region BB is smaller than an area of the pixel electrode 200 of the sub-pixel PX located in the display region AA. The pixel electrode 200 can include branch electrodes and slots located between the branch electrodes. The area of the pixel electrode 200 can be a sum of areas of the branch electrodes of the pixel electrode 200.

The area of the pixel electrode 200 of the sub-pixel PX located in the non-display region BB is smaller than the area of the pixel electrode 200 of the sub-pixel PX located in the display region AA, which can be achieved by reducing a width or a length of the pixel electrode 200 in the non-display region BB.

In an embodiment of the present disclosure, as shown in FIG. 13, the sub-pixel PX located in the display region AA includes the pixel electrode 200, but the sub-pixel PX located in the non-display region BB does not include the pixel electrode 200.

Although the area of the pixel electrode 200 of the sub-pixel PX in the non-display region BB is designed to be small or the sub-pixel PX in the non-display region BB does not include the pixel electrode 200, other structures of the sub-pixel PX in the display region BB can also be arranged in the sub-pixel PX located in the non-display region BB. For example, the sub-pixel PX in the non-display region BB includes a thin film transistor, via holes, a scanning line, a data line, and the like, and can further include a common electrode.

In an embodiment of the present disclosure, the size of the pixel electrode 200 in the non-display region BB can be reduced or no pixel electrode 200 is provided in the non-display region BB, so that an area of the sub-pixel PX in the non-display region BB can be reduced, and an area of the non-display region BB can be reduced, thereby achieving a larger screen-to-body ratio of the display panel.

In an embodiment of the present disclosure, as shown in FIG. 14 and FIG. 15, the display panel further includes multiple thin film transistors 100. The thin film transistors 100 are arranged corresponding to the sub-pixels PXs, that is, the sub-pixels PXs each include the thin film transistor 100 corresponding thereto, and the sub-pixel PX includes at least one thin film transistor 100. The thin film transistor 100 includes a semiconductor layer CL, a source, a drain, and a gate. The source of the thin film transistor 100 is electrically connected to a data line DL, and the gate of the thin film transistor 100 is electrically connected to a scanning line GL. The non-display region BB covers at least a portion of the thin film transistor 100 located in the second region 02. That is, the thin film transistor 100 is also provided in a part of the non-display region BB located in the second region 02. Such design can gradually change the difference between the load of the signal line in the first region 01 and the load of the signal line in the second region 02 through the thin film transistor 100.

In an embodiment of the present disclosure, as shown in FIG. 14, at least one of the semiconductor layer CL, the data line DL, or the scanning line GL in the second region 02 includes one portion located in the non-display region BB and another portion located in the display region AA, and the one portion has a width greater than a width of the another portion. By increasing the width of the at least one of the semiconductor layer CL, the data line DL, or the scanning line GL in the non-display region BB of the second region 02, the coupling capacitance of the at least one of the semiconductor layer CL, the data line DL, or the scanning line GL with other signal lines in the second region 02 can be increased, so that the load of these structures can be increased.

Since the sub-pixels PXs in a same row can share the scanning line GL, the sub-pixels PXs in a same column can share the data line DL, and the sub-pixels PXs in multiple rows and columns can share the semiconductor layer CL, a width of a portion of at least one of these structures located in the non-display region BB is greater than a width of another portion thereof located in the display region AA, that is, the same one scanning line GL has different width in the display region AA and the non-display region BB, or the same one scanning line DL has different width in the display region AA and the non-display region BB, or the semiconductor layer CL has different width in the display region AA and the non-display region BB. The portion with a larger width is located in the non-display region BB, which will not cause the width of the same structure in the display region AA to be different, and the display is not affected.

In an embodiment, for the portion, located in the non-display region BB, of at least one of the semiconductor layer CL, the data line DL, or the scanning line GL in the second region 02, the farther from the first region 01, the greater the width thereof. Since the number of the sub-pixels PXs corresponding to these structures gradually decreases, the gradual variation the load of these structures causes a problem of gradual variation in luminance. This technical solution effectively compensates luminance by gradually increasing the width of these structures in the non-display region BB.

Figure 17:
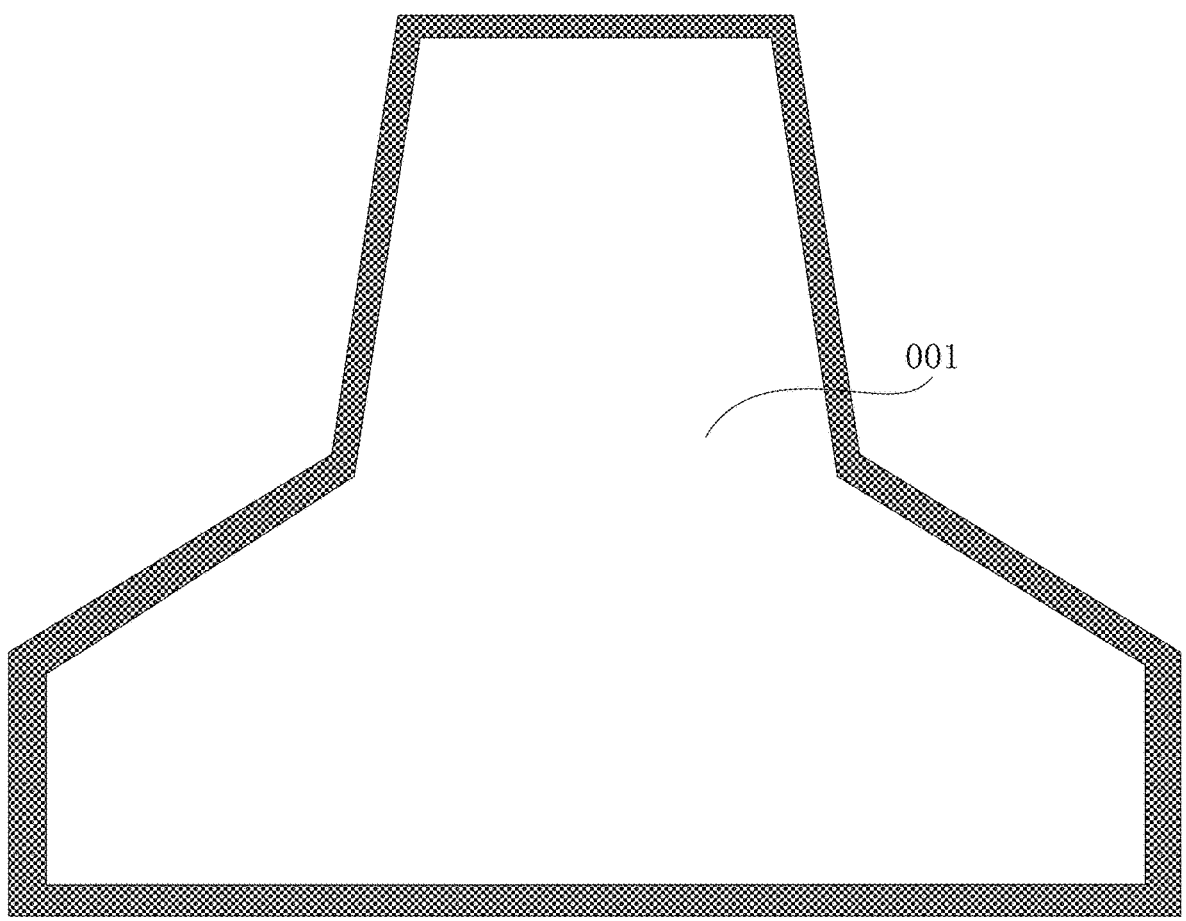
FIG. 17 is a schematic diagram showing a display apparatus according to an embodiment of the present disclosure.

In an embodiment of the present disclosure, as shown in FIG. 15 and FIG. 17, at least one of the semiconductor layer CL, the data line DL, or the scanning line GL in the second region 02 includes one portion located in the non-display region BB and another portion located in the display region AA, and in regions with a same area, a length of the one portion is greater than a length of the another portion. By increasing the length of the at least one of the semiconductor layer CL, the data line DL, or the scanning line GL in the non-display region BB of the second region 02, the load of the at least one of the semiconductor layer CL, the data line DL, or the scanning line GL in the second region 02 can be increased. By increasing the length of these structures, i.e., by setting the portions of the structures located in the non-display region BB to be in a shape of a broken line. The design of the broken line shape located in the non-display region BB cannot affect the normal display of the display region AA, and can increase the resistance of these structures and the coupling capacitance with other structures, thereby increasing the load of these structures.

In an embodiment, for the portion, located in the non-display region BB, of the at least one of the semiconductor layer CL, the data line DL, or the scanning line GL in the second region 02, the farther from the first region 01, the greater the length thereof. Since the number of the sub-pixels PXs corresponding to these structures gradually decreases, the gradual variation the load of these structures causes a problem of gradual variation in luminance. This technical solution effectively compensate luminance by gradually increasing the length of these structures in the non-display region BB.

FIG. 17 is a schematic diagram showing a display apparatus according to an embodiment of the present disclosure.

As shown in FIG. 17, the present disclosure provides a display apparatus. The display apparatus includes the display panel 001 provided in the above embodiments. The display apparatus according to the present disclosure is a profiled display apparatus, e.g., a "T"-shaped display apparatus or an "L"-shaped display apparatus, and can be used for wearable display or in-vehicle display.

In an embodiment of the present disclosure, the display apparatus is a display apparatus displaying with a non-uniform width. In the second region 02, the numbers of the sub-pixels PXs in the second sub-pixel groups 20 that are arranged along a direction from the first region 01 to the second region 02 gradually decrease, thereby avoiding obvious difference in display luminance caused by abrupt change of the load of the signal lines in the second region 02 and the first region 01. The first sub-region 021 of the second region 02 is closer to the first region 01 than the second sub-region 022, and in the direction from the first region 01 to the second region 02, the numbers of the sub-pixels PXs in the two sub-pixel groups 20 gradually decreases and the decreasing rate is large. On the one hand, the obvious difference in display luminance at the junction between the second region 02 and the first region 01 can be avoided. On the other hand, the display width of the second region 02 can quickly reach a preset width.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising a plurality of sub-pixels, wherein the display panel has a first region and a second region that are arranged along a first direction,
   wherein first sub-pixel groups are located in the first region of the display panel and are arranged along the first direction, and at least one of the first sub-pixel groups comprises at least two sub-pixels of the plurality of sub-pixels that are arranged along a second direction intersecting with the first direction;
   wherein second sub-pixel groups are located in the second region of the display panel and are arranged along the first direction, and at least one of the second sub-pixel groups comprises at least two sub-pixels of the plurality of sub-pixels that are arranged along the second direction;

wherein a number of the at least two sub-pixels in each of the first sub-pixel groups is greater than a number of the at least two sub-pixels in each of the second sub-pixel groups; and, among the second sub-pixel groups, a number of the at least two sub-pixels in one of the second sub-pixel groups that is close to the first region is greater than a number of the at least two sub-pixels in one of the second sub-pixel groups that is away from the first region;

wherein the second region comprises a first sub-region and a second sub-region, the first sub-region is closer to the first region than the second sub-region; and, in a direction from the first region to the second region, a variation rate of the numbers of the sub-pixels in at least two of the second sub-pixel groups in the first sub-region is greater than a variation rate of the numbers of the sub-pixels in at least two of the second sub-pixel groups in the second sub-region; and wherein at least one of the variation rate of the numbers of the sub-pixels in the at least two of the second sub-pixel groups in the first sub-region or the variation rate of the numbers of the sub-pixels in the at least two of the second sub-pixel groups in the second sub-region has a fixed value.

2. The display panel according to claim 1, wherein a number m1 of the at least two sub-pixels in one of two adjacent second sub-pixel groups of the second sub-pixel groups and a number m2 of the at least two sub-pixels in the other one of the two adjacent second sub-pixel groups satisfy m2≤m1*0.95.

3. The display panel according to claim 1, wherein in the direction from the first region to the second region, at least one of the variation rate of the numbers of the sub-pixels in the at least two of the second sub-pixel groups in the first sub-region or the variation rate of the numbers of the sub-pixels in the at least two of the second sub-pixel groups in the second sub-region decreases.

4. The display panel according to claim 1, wherein in the direction from the first region to the second region, the variation rate of the numbers of the sub-pixels in the at least two of the second sub-pixel groups in the first sub-region decreases, and the variation rate of the numbers of the sub-pixels in the at least two of the second sub-pixel groups in the second sub-region has a fixed value; or in the direction from the first region to the second region, the variation rate of the numbers of the sub-pixels in the at least two of the second sub-pixel groups in the first sub-region has a fixed value, and the variation rate of the numbers of the sub-pixels in the at least two of the second sub-pixel groups in the second sub-region decreases.

5. The display panel according to claim 1, wherein the second region comprises at least one bevel edge; and each of at least two of the plurality of sub-pixels in the second region comprises a portion, and the portions of the at least two of the plurality of sub-pixels in the second region are located at a same side of one of the at least one bevel edge; and a minimum angle formed between the bevel edge and the first direction is a first angle α, where α≥0.5°; or a minimum angle formed between the bevel edge and the second direction is a second angle β, where β≥0.5°.

6. The display panel according to claim 5, wherein the bevel edge comprises a first edge and a second edge that are connected to each other, wherein the first edge is adjacent to the first sub-region, and the second edge is adjacent to the second sub-region; and a minimum angle formed between the first edge and the second direction is the second angle β, and a minimum angle formed between the second edge and the first direction is the first angle α.

7. The display panel according to claim 6, wherein at least one of the first edge or the second edge has a straight-line shape.

8. The display panel according to claim 6, wherein one of the first edge and the second edge has an arc shape, and the other one of the first edge and the second edge has a straight-line shape.

9. The display panel according to claim 1, wherein the display panel has a first side and a second side that are opposite to each other along the second direction;

one of at least two of the plurality of sub-pixels that are closest to the first side in the first region, is not aligned with one of at least two of the plurality of sub-pixels that are closest to the first side in the second region in the first direction; and one of at least two of the plurality of sub-pixels that are closest to the second side in the first region, is not aligned with one of at least two of the plurality of sub-pixels that are closest to the second side in the second region in the first direction.

10. The display panel according to claim 9, wherein the first side and the second side are axisymmetric.

11. The display panel according to claim 1, wherein the display panel has a first side and a second side that are opposite to each other along the second direction;

one of at least two of the plurality of sub-pixels that are closest to the first side in the first region, is not aligned with one of at least two of the plurality of sub-pixels that are closest to the first side in the second region in the first direction; and one of at least two of the plurality of sub-pixels that are closest to the second side in the first region, is aligned with one of at least two of the plurality of sub-pixels that are closest to the second side in the second region in the first direction.

12. The display panel according to claim 1, wherein the display panel has a display region and a non-display region, wherein the display region is adjacent to the non-display region, and the non-display region surrounds the display region; and at least one of the plurality of sub-pixels comprises a portion located in the display region.

13. A display panel, comprising a plurality of sub-pixels, wherein the display panel has a first region and a second region that are arranged along a first direction, wherein first sub-pixel groups are located in the first region of the display panel and are arranged along the first direction, and at least one of the first sub-pixel groups comprises at least two sub-pixels of the plurality of sub-pixels that are arranged along a second direction intersecting with the first direction;

wherein second sub-pixel groups are located in the second region of the display panel and are arranged along the first direction, and at least one of the second sub-pixel groups comprises at least two sub-pixels of the plurality of sub-pixels that are arranged along the second direction;

wherein a number of the at least two sub-pixels in each of the first sub-pixel groups is greater than a number of the at least two sub-pixels in each of the second sub-pixel groups; and, among the second sub-pixel groups, a number of the at least two sub-pixels in one of the second sub-pixel groups that is close to the first region is greater than a number of the at least two sub-pixels in one of the second sub-pixel groups that is away from the first region;

wherein the second region comprises a first sub-region and a second sub-region, the first sub-region is closer to the first region than the second sub-region; and, in a direction from the first region to the second region, a variation rate of the numbers of the sub-pixels in at least two of the second sub-pixel groups in the first sub-region is greater than a variation rate of the numbers of the sub-pixels in at least two of the second sub-pixel groups in the second sub-region;

wherein the display panel has a display region and a non-display region, wherein the display region is adjacent to the non-display region, and the non-display region surrounds the display region; and the non-display region covers at least two of the plurality of sub-pixels that are located in the second region.

14. The display panel according to claim 13, wherein at least one of the plurality of sub-pixels comprises a pixel electrode, wherein an area of the pixel electrode of one of the plurality of sub-pixels in the non-display region is smaller than an area of the pixel electrode of one of the plurality of sub-pixels in the display region.

15. The display panel according to claim 13, wherein each of at least one sub-pixel of the plurality of sub-pixels located in the display region each comprise a pixel electrode, and each of at least one sub-pixel of the plurality of sub-pixels located in the non-display region does not comprise the pixel electrode.

16. The display panel according to claim 13, further comprising:
a plurality of thin film transistors that is arranged corresponding to the plurality of sub-pixels,
wherein at least one of the plurality of thin film transistors comprises a semiconductor layer, a source electrically connected to a data line, a drain, and a gate electrically connected to a scanning line; and
the non-display region covers at least one of the plurality of thin film transistors located in the second region.

17. The display panel according to claim 16, wherein at least one of the semiconductor layer, the data line, or the scanning line in the second region comprises one portion located in the non-display region and another portion located in the display region, and the one portion has a width greater than a width of the another portion.

18. The display panel according to claim 16, wherein at least one of the semiconductor layer, the data line, or the scanning line in the second region comprises one portion located in the non-display region and another portion located in the display region, and in regions with a same area, the one portion has a length greater than a length of the another portion.

19. A display apparatus, comprising a display panel,
wherein the display panel comprises a plurality of sub-pixels, wherein the display panel has a first region and a second region that are arranged along a first direction,
wherein first sub-pixel groups are located in the first region of the display panel and are arranged along the first direction, and at least one of the first sub-pixel groups comprises at least two sub-pixels of the plurality of sub-pixels that are arranged along a second direction intersecting with the first direction;
wherein second sub-pixel groups are located in the second region of the display panel and are arranged along the first direction, and at least one of the second sub-pixel groups comprises at least two sub-pixels of the plurality of sub-pixels that are arranged along the second direction;
wherein a number of the at least two sub-pixels in each of the first sub-pixel groups is greater than a number of the at least two sub-pixels in each of the second sub-pixel groups; and, among the second sub-pixel groups, a number of the at least two sub-pixels in one of the second sub-pixel groups that is close to the first region is greater than a number of the at least two sub-pixels in one of the second sub-pixel groups that is away from the first region;
wherein the second region comprises a first sub-region and a second sub-region, the first sub-region is closer to the first region than the second sub-region; and, in a direction from the first region to the second region, a variation rate of the numbers of the sub-pixels in at least two of the second sub-pixel groups in the first sub-region is greater than a variation rate of the numbers of the sub-pixels in at least two of the second sub-pixel groups in the second sub-region; and
wherein at least one of the variation rate of the numbers of the sub-pixels in the at least two of the second sub-pixel groups in the first sub-region or the variation rate of the numbers of the sub-pixels in the at least two of the second sub-pixel groups in the second sub-region has a fixed value.

* * * * *